United States Patent
Cheng et al.

(10) Patent No.: US 12,183,799 B2
(45) Date of Patent: Dec. 31, 2024

(54) SEMICONDUCTOR DEVICE WITH GATE ISOLATION FEATURES AND FABRICATION METHOD OF THE SAME

(71) Applicant: Taiwan Semiconductor Manufacturing Company, Ltd., Hsin-Chu (TW)

(72) Inventors: Jung-Chien Cheng, Tainan (TW); Kuo-Cheng Chiang, Hsinchu County (TW); Shi Ning Ju, Hsinchu (TW); Guan-Lin Chen, Hsinchu County (TW); Jia-Chuan You, Taoyuan County (TW); Chia-Hao Chang, Hsinchu (TW); Chih-Hao Wang, Hsinchu County (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/447,870

(22) Filed: Aug. 10, 2023

(65) Prior Publication Data

US 2023/0395686 A1 Dec. 7, 2023

Related U.S. Application Data

(62) Division of application No. 17/464,142, filed on Sep. 1, 2021, now Pat. No. 11,876,119.

(Continued)

(51) Int. Cl.
*H01L 29/423* (2006.01)
*H01L 21/8234* (2006.01)
(Continued)

(52) U.S. Cl.
CPC .......... *H01L 29/42392* (2013.01); *H01L 21/823412* (2013.01); *H01L 21/823418* (2013.01);
(Continued)

(58) Field of Classification Search
CPC .......... H01L 29/42392; H01L 29/0649; H01L 29/6656; H01L 29/66742; H01L 29/78618; H01L 29/78696; H01L 21/823412; H01L 21/823418; H01L 21/823468; H01L 21/823481; H01L 23/485; H01L 27/088
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,836,016 | B2 | 9/2014 | Wu et al. |
| 8,841,701 | B2 | 9/2014 | Lin et al. |
| 8,847,293 | B2 | 9/2014 | Lee et al. |

(Continued)

*Primary Examiner* — Dao H Nguyen
(74) *Attorney, Agent, or Firm* — HAYNES AND BOONE, LLP

(57) ABSTRACT

A semiconductor device includes a first channel member over a first backside dielectric feature, a first gate structure engaging the first channel member, a second channel member over a second backside dielectric feature, a second gate structure engaging the second channel member, and a first isolation feature includes a first portion laterally between the first and second backside dielectric features and a second portion laterally between the first and second gate structures. The first isolation feature is in physical contact with the first and second gate structures.

20 Claims, 35 Drawing Sheets

Related U.S. Application Data

(60) Provisional application No. 63/157,227, filed on Mar. 5, 2021.

(51) Int. Cl.
*H01L 29/06* (2006.01)
*H01L 29/66* (2006.01)
*H01L 29/786* (2006.01)

(52) U.S. Cl.
CPC ........... *H01L 21/823468* (2013.01); *H01L 21/823481* (2013.01); *H01L 29/0649* (2013.01); *H01L 29/6656* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 8,853,025 | B2 | 10/2014 | Zhang et al. |
| 8,860,148 | B2 | 10/2014 | Hu et al. |
| 8,962,400 | B2 | 2/2015 | Tsai et al. |
| 9,093,514 | B2 | 7/2015 | Tsai et al. |
| 9,105,490 | B2 | 8/2015 | Wang et al. |
| 9,236,267 | B2 | 1/2016 | De et al. |
| 9,236,300 | B2 | 1/2016 | Liaw |
| 9,245,805 | B2 | 1/2016 | Yeh et al. |
| 9,520,482 | B1 | 12/2016 | Chang et al. |
| 9,576,814 | B2 | 2/2017 | Wu et al. |
| 2020/0328208 | A1* | 10/2020 | Chiang .............. H01L 29/66545 |
| 2021/0375664 | A1* | 12/2021 | Chang ................ H01L 23/53295 |
| 2021/0376130 | A1* | 12/2021 | Chung ............. H01L 21/823418 |
| 2022/0262915 | A1* | 8/2022 | Su ..................... H01L 29/78696 |
| 2022/0352150 | A1* | 11/2022 | Chiang ........... H01L 21/823481 |

* cited by examiner

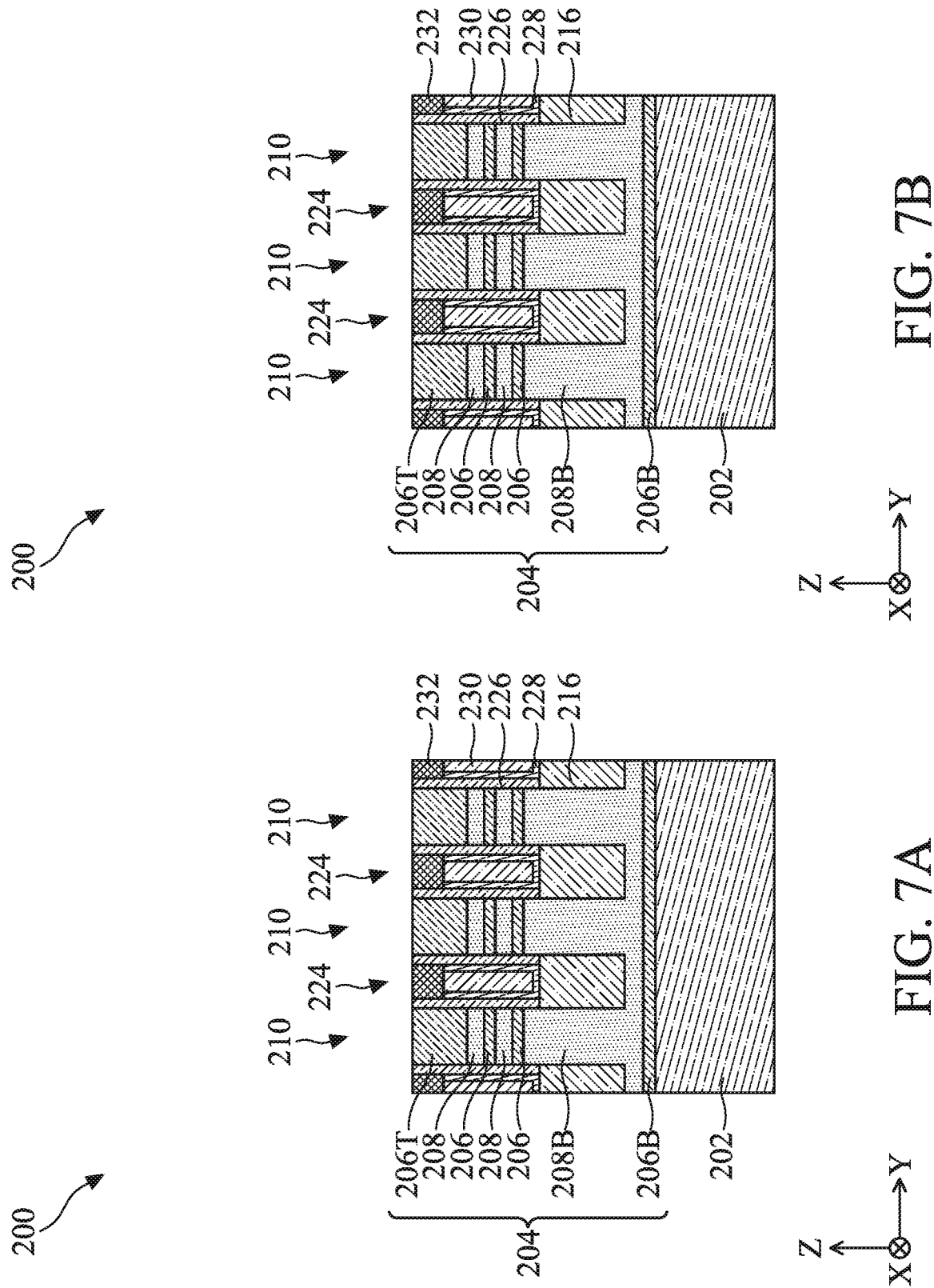

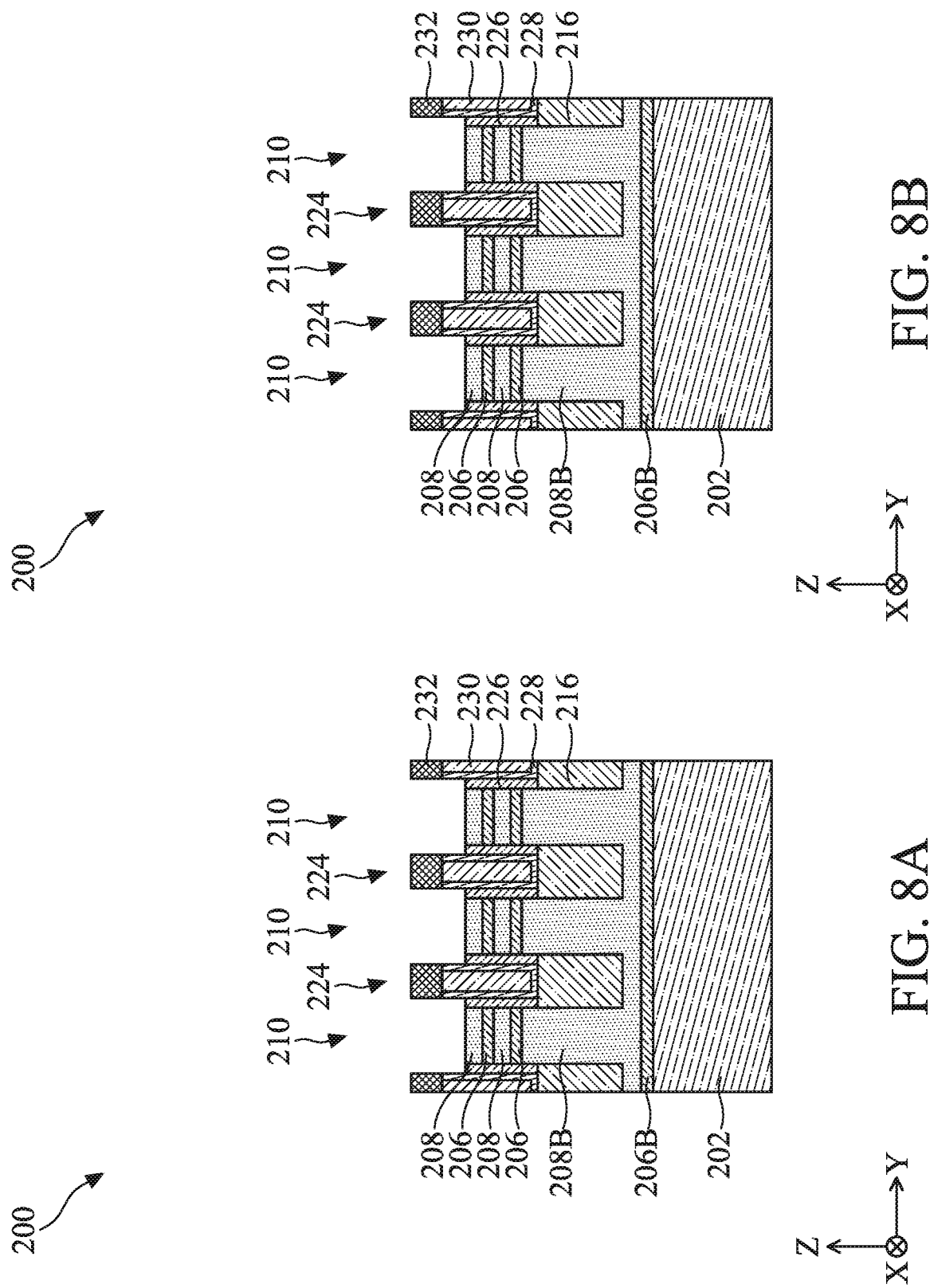

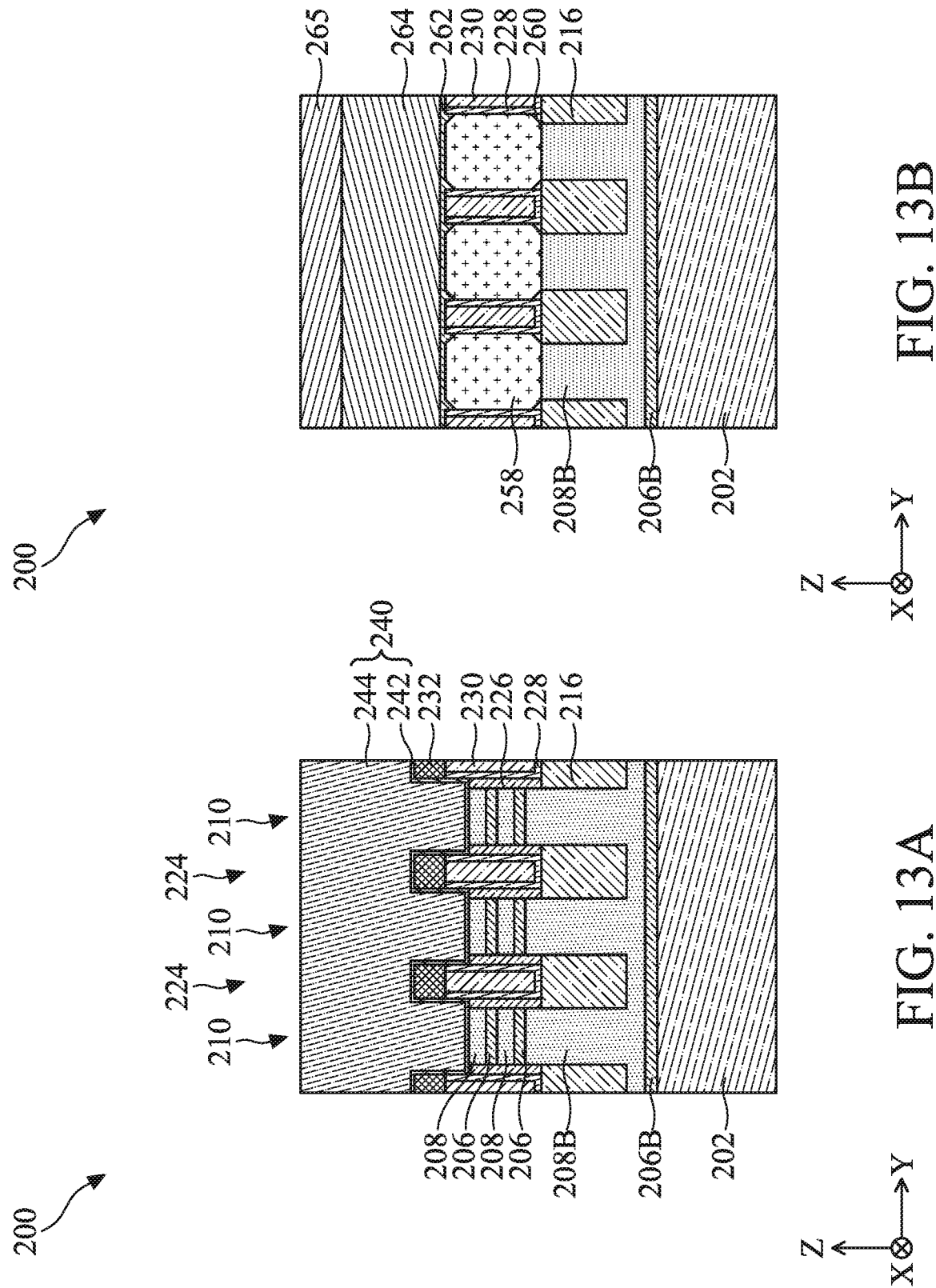

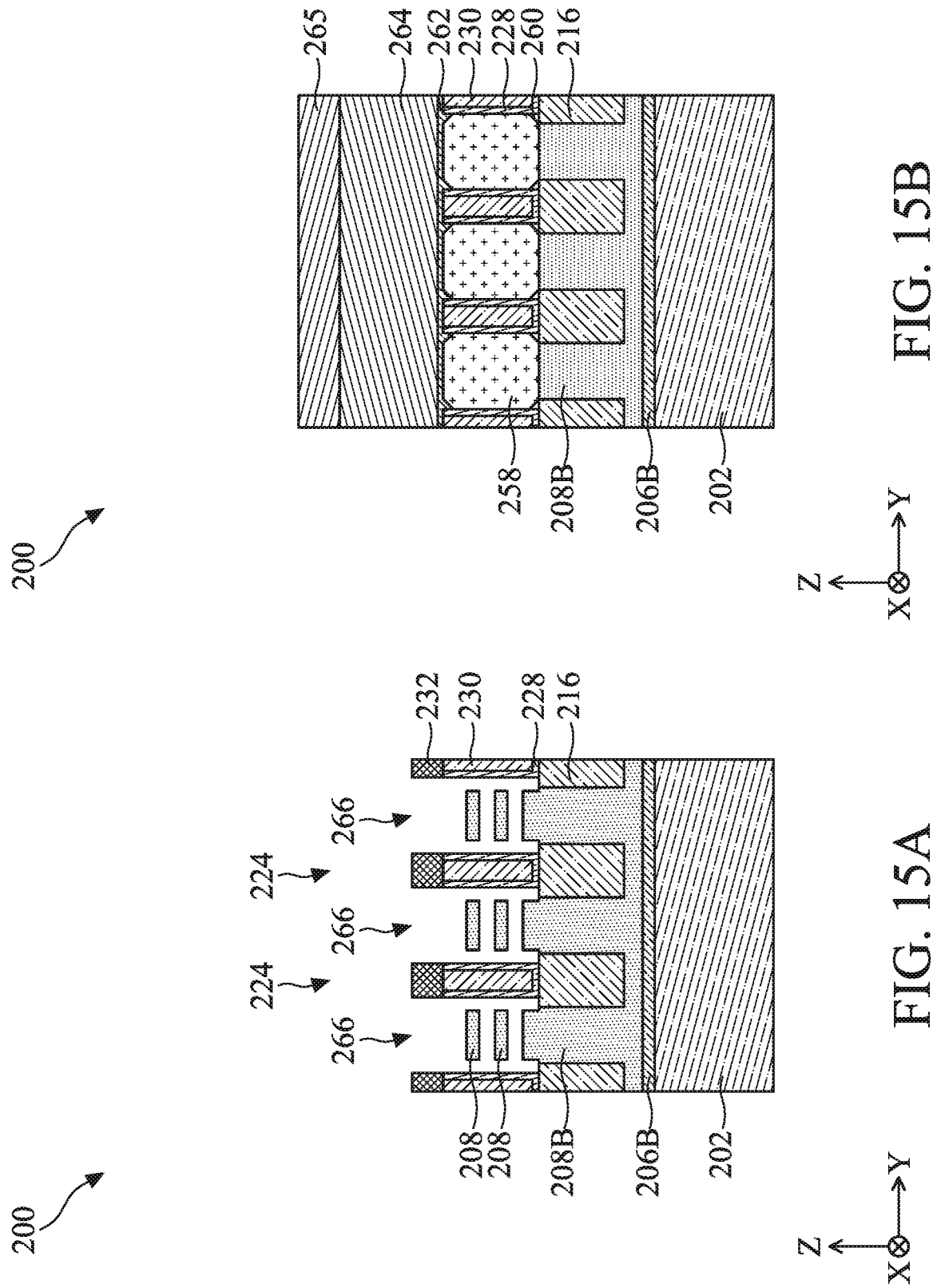

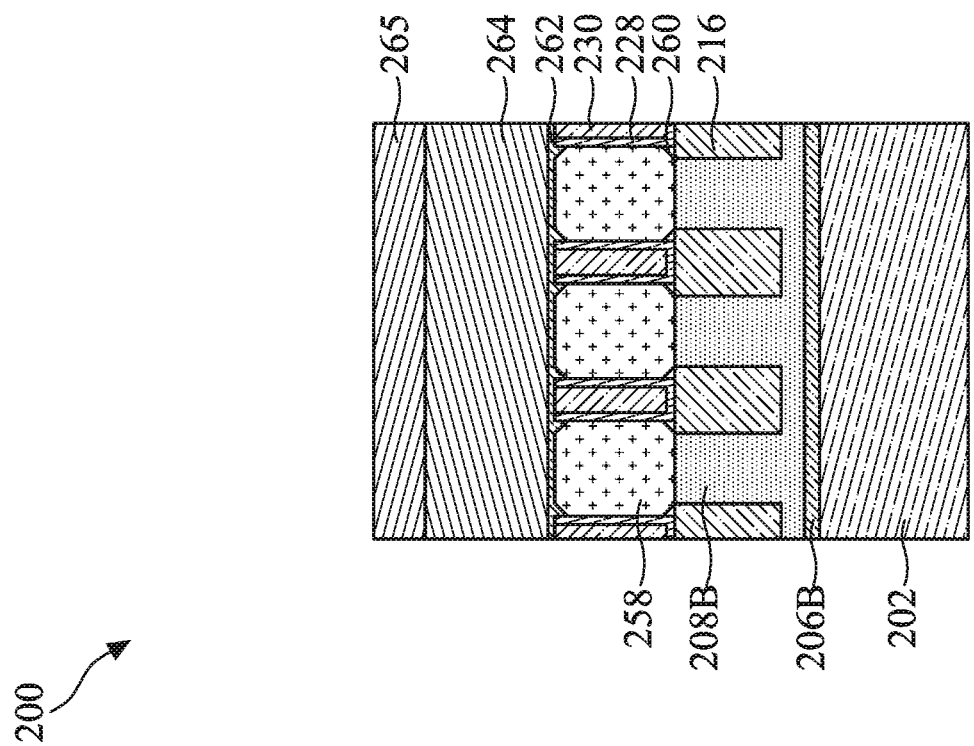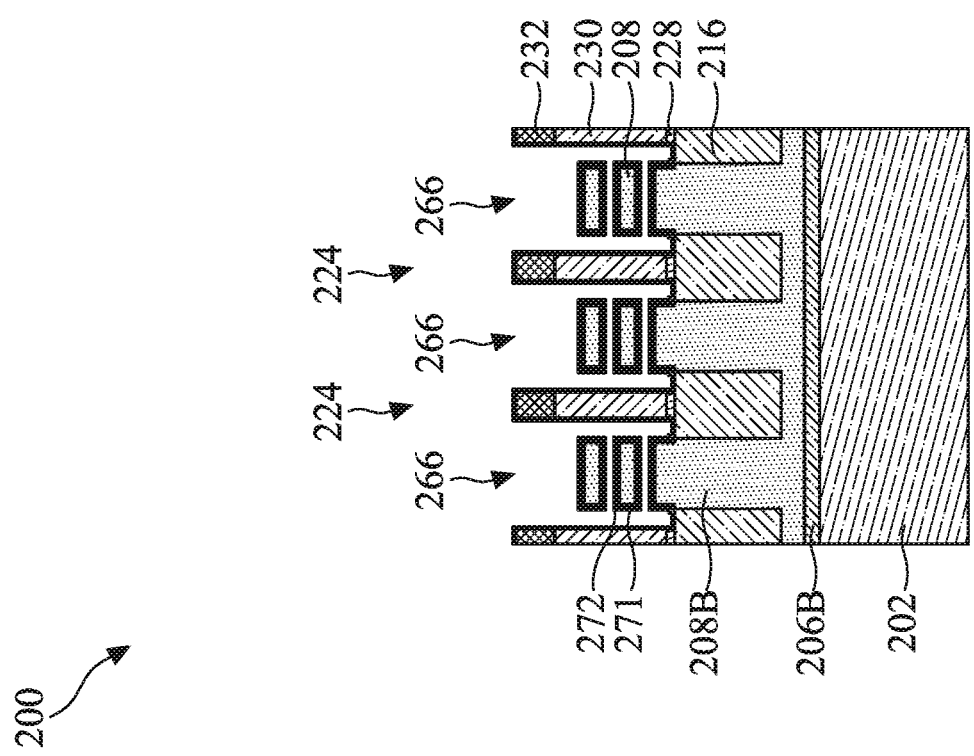
FIG. 17A
FIG. 17B

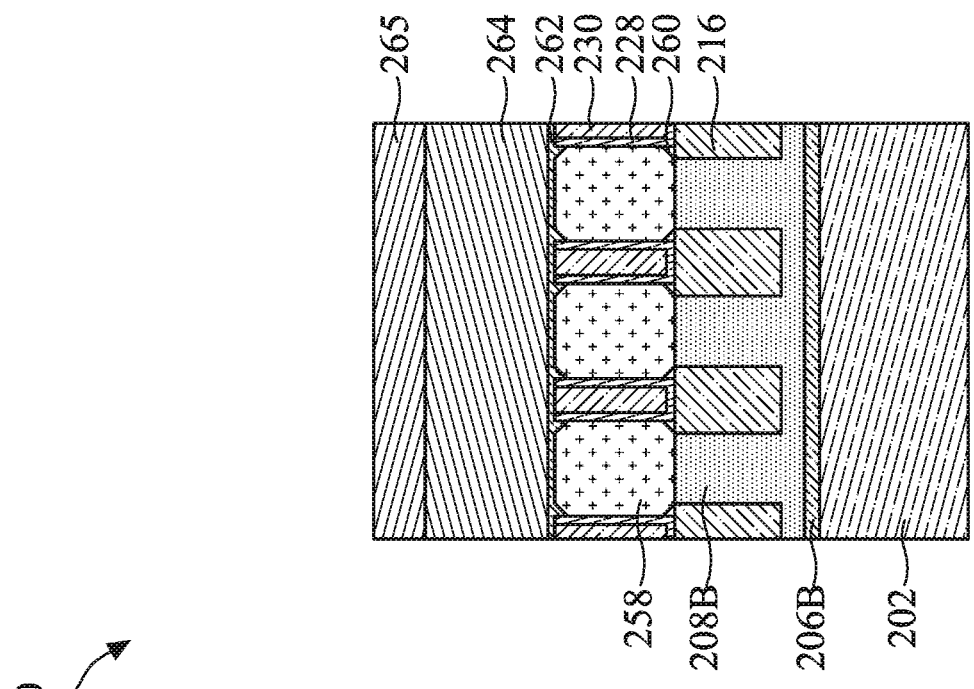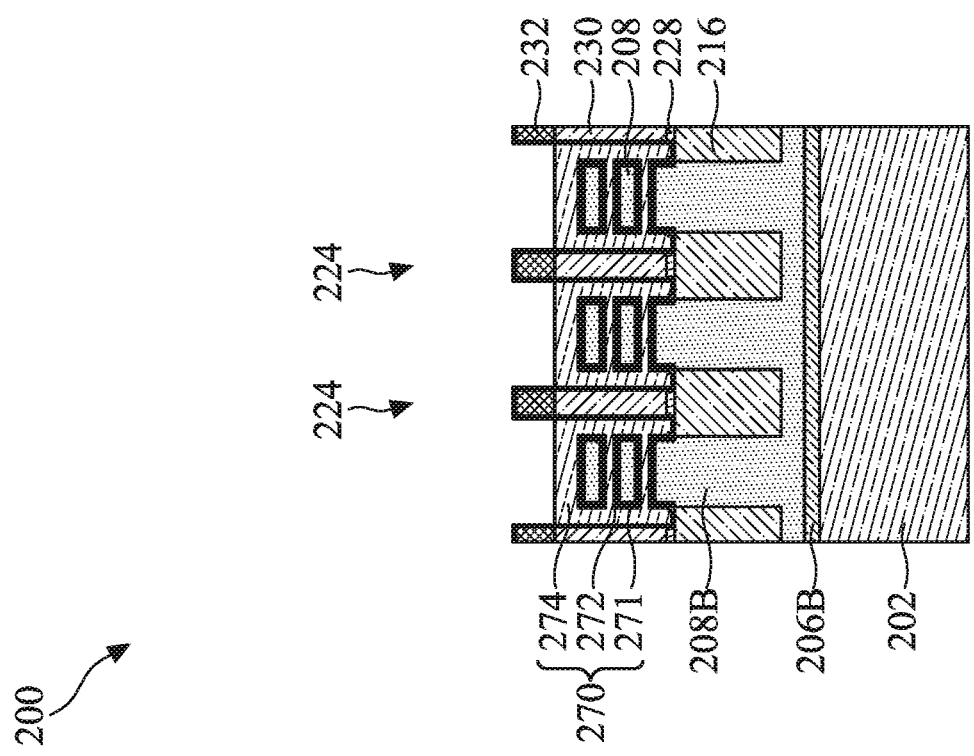
FIG. 18B
FIG. 18A

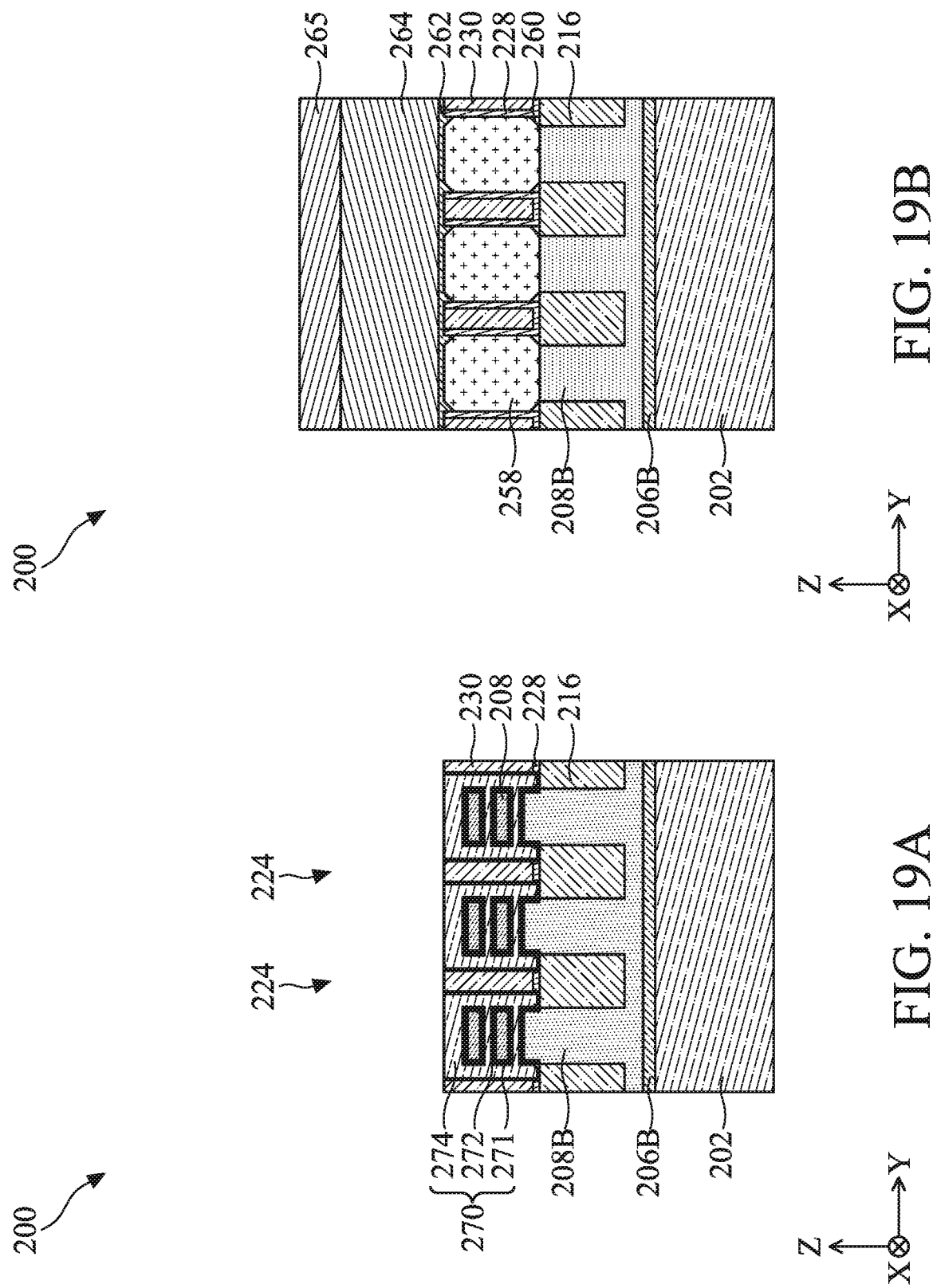

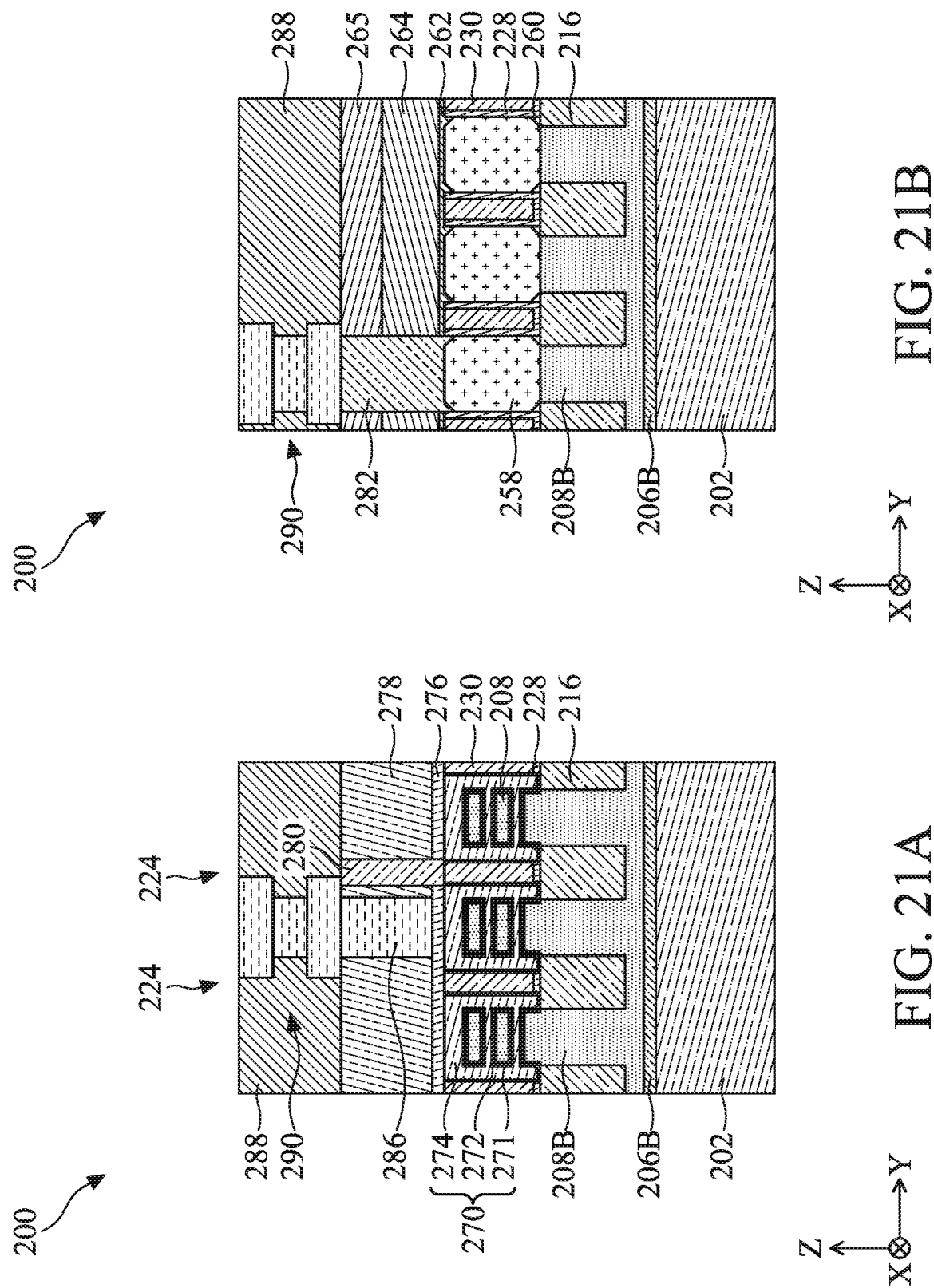

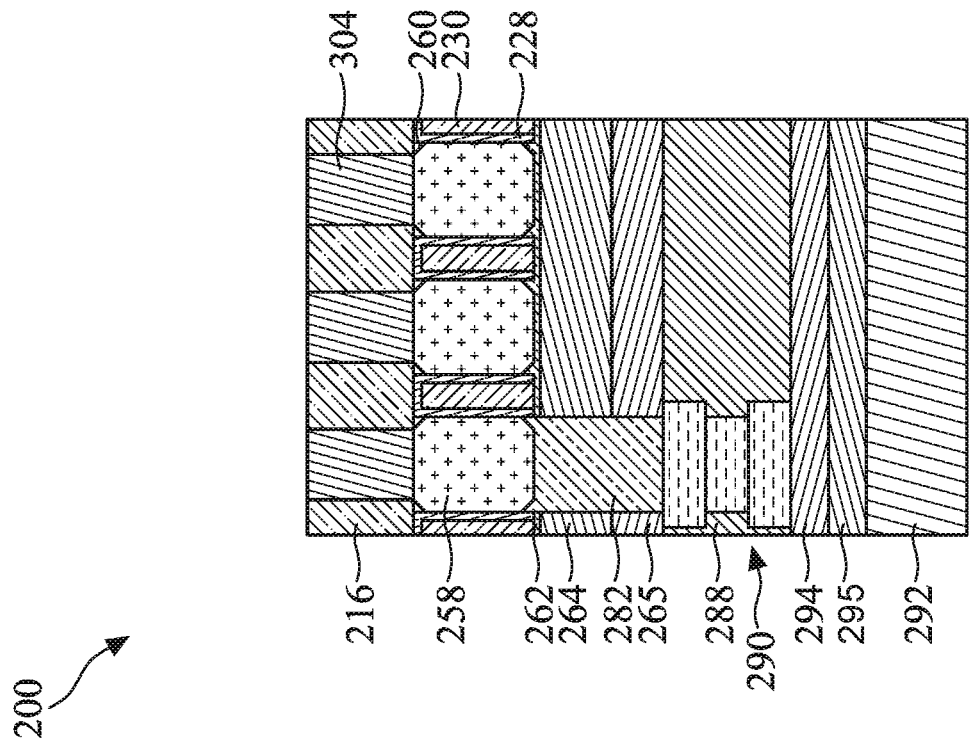
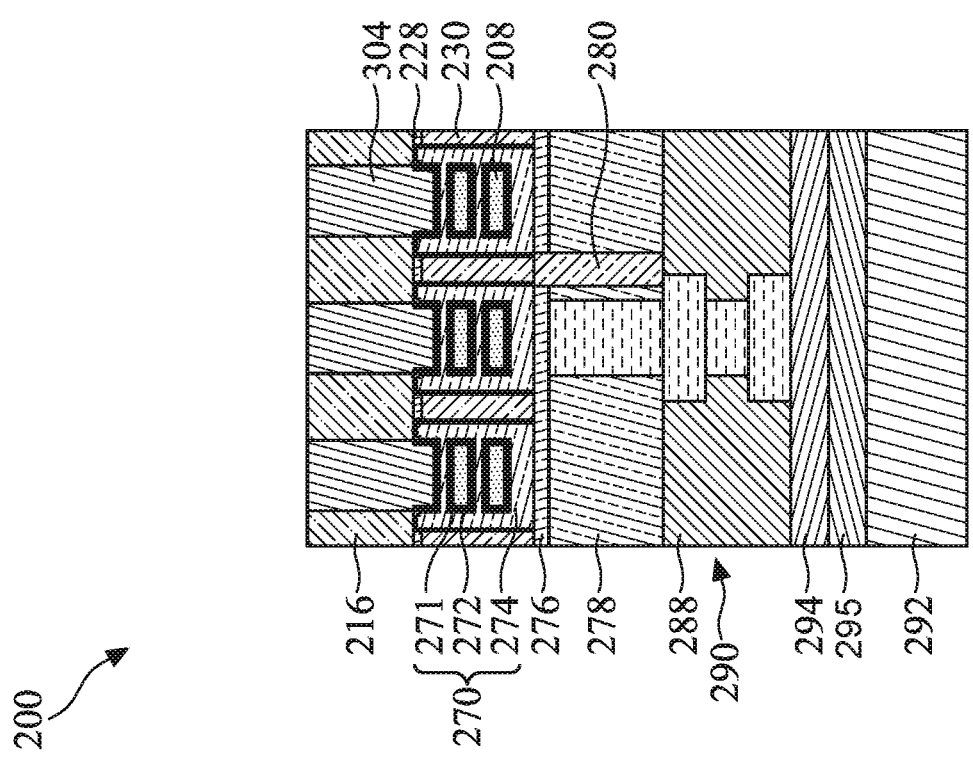
FIG. 25A
FIG. 25B

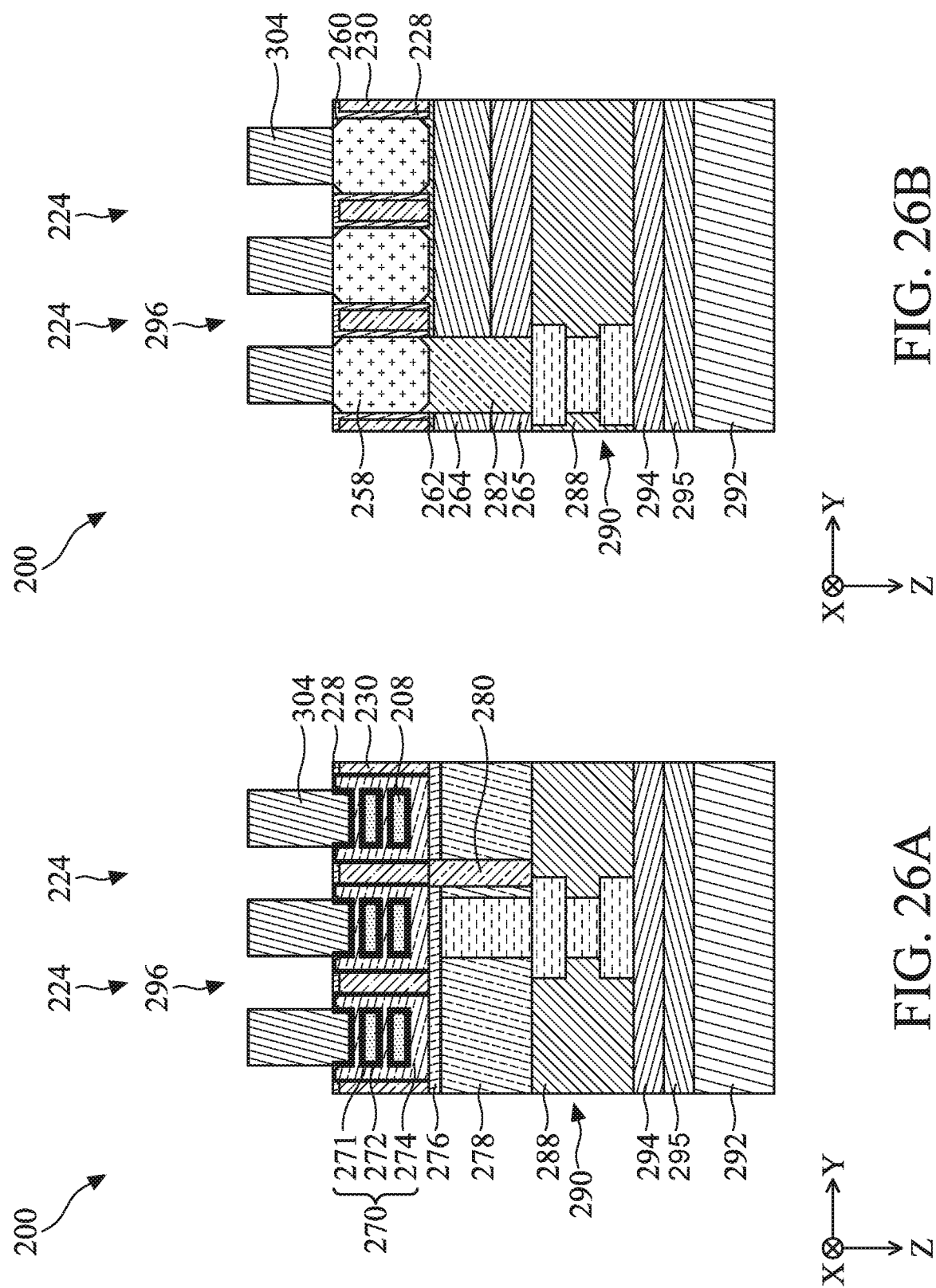

SEMICONDUCTOR DEVICE WITH GATE ISOLATION FEATURES AND FABRICATION METHOD OF THE SAME

PRIORITY DATA

This is a divisional application of U.S. patent application Ser. No. 17/464,142, filed on Sep. 1, 2021, which claims priority to U.S. Provisional Patent Application No. 63/157,227, filed on Mar. 5, 2021, entitled "Gate Isolation Structure and Method of Forming the Same", each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate metal-oxide-semiconductor field effect transistors (multi-gate MOSFETs, or multi-gate devices) have been introduced to improve gate control by increasing gate-channel coupling, reducing off-state current, and reducing short-channel effects (SCEs). A multi-gate device generally refers to a device having a gate structure (also known as gate stack), or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate structure on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

To continue to provide the desired scaling and increased density for MBC transistors in smaller technology nodes, dielectric fins (also known as hybrid dielectric fins or hybrid fins) have been introduced to provide isolation between gate structures. With further reducing gate critical dimensions (CDs), parasitic capacitance between gate structures may degrade device performance, such as circuit speed and cross-talk coupling, even with dielectric fins made of low-k dielectric material. Measures to improve isolation between gate structures of MBC transistors may face challenges in forming gate isolation features while further reducing parasitic capacitance. While existing semiconductor devices are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, and 33A illustrate fragmentary cross-sectional views in a channel region of a workpiece during a fabrication process according to the method of FIGS. 1A and 1B, according to one or more aspects of the present disclosure.

FIGS. 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, 29B, 30B, 31B, 32B, and 33B illustrate fragmentary cross-sectional views in a source/drain region of a workpiece during a fabrication process according to the method of FIGS. 1A and 1B, according to one or more aspects of the present disclosure.

DETAILED DESCRIPTION

Figure 1A:
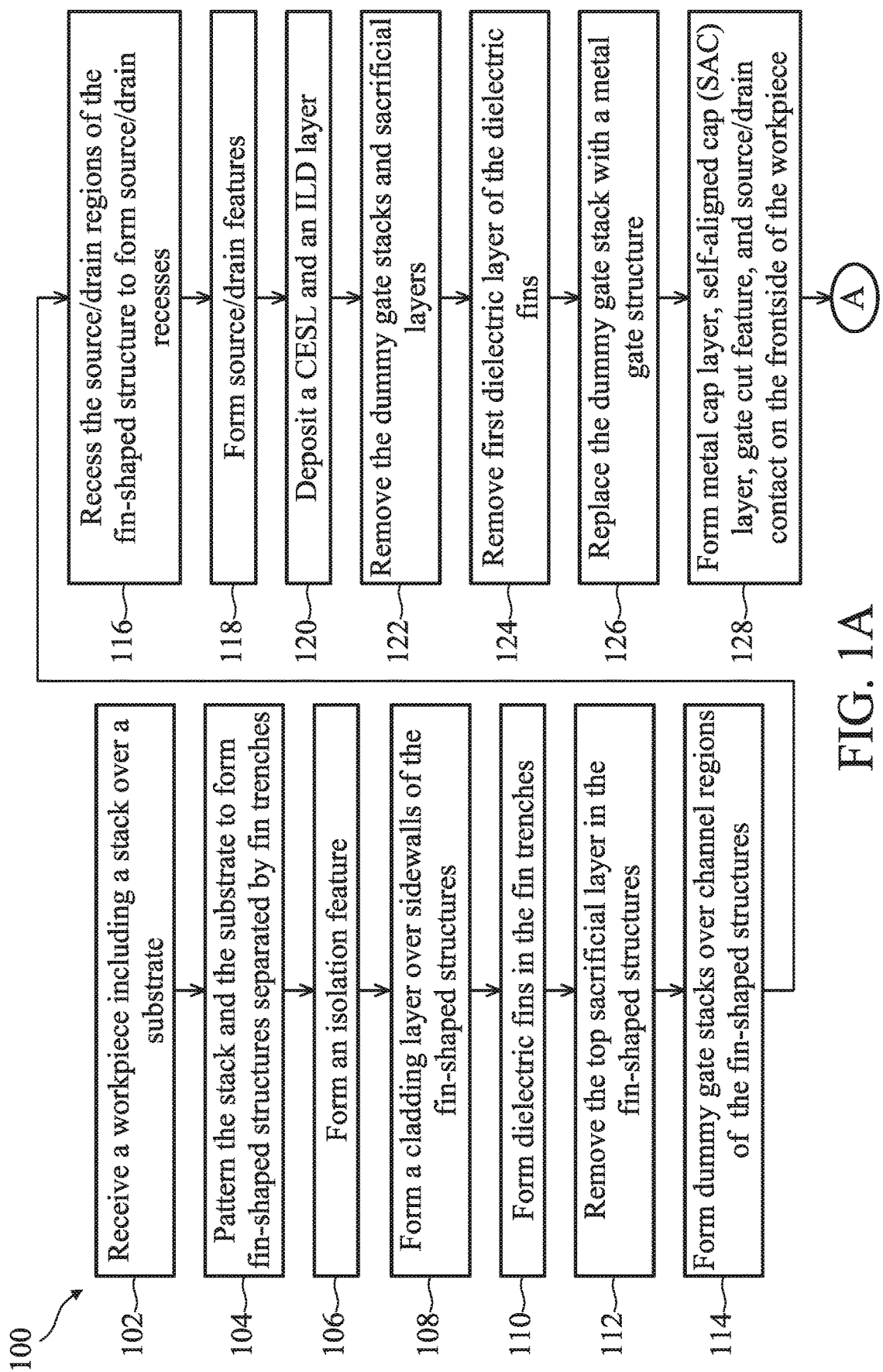
FIGS. 1A and 1B illustrate a flow chart of a method for forming a semiconductor device with gate isolation structures formed from a backside of the semiconductor device, according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

In semiconductor fabrication, cut metal gate (CMG) process refers to a process for forming a dielectric feature to divide a continuous gate structure that spans over more than one active region into two or more segments. Such a dielectric feature may be referred to as a gate cut feature or a gate isolation feature. In some existing CMG processes, a gate isolation feature is formed on a dielectric fin (also referred to as a hybrid fin). With the gate cut feature on top and the dielectric fin on bottom, they work in synergy to separate an otherwise continuous gate structure into segments. Even though low-k dielectric material or extreme low-k dielectric material has been introduced to form hybrid fins, with further reducing gate critical dimensions (CDs), parasitic capacitance still imposes a challenge to further device performance, such as circuit speed and cross-talk coupling. Besides using a low-k or extreme low-k dielectric material, another approach is to trim gate electrodes to increase distance between adjacent gate structures and thus allow wider gate isolation features therebetween. However, such distance has been defined by the dielectric fin between adjacent gate structures, causing challenges in further enlarging the distance between adjacent gate structures.

The present disclosure is generally related to semiconductor devices and the fabrication thereof, and more particularly to gate isolation features formed from backsides of the semiconductor devices to improve isolation between gate structures with reduced parasitic capacitance and smaller CDs. The gate isolation feature according to the present disclosure extends from the backside of the substrate through the gate structure. Processes of the present disclosure are not only formed from the backside but are also self-aligned to avoid defects associated with mask misalignment. Additionally, embodiments of the present disclosure also provide process window to trim gate electrodes to increase distance between adjacent gate structures, which in turn further reduces parasitic capacitance.

Embodiments of the present disclosure may be implemented to advance semiconductor devices that may include multi-gate devices. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Embodiments of the present disclosure are described using an MBC transistor structure, which is for illustration purpose only and should not be construed as limiting the scope of the present disclosure; for example, the present disclosure may also be applicable to other multi-gate devices, including FinFET transistors.

Figure 1B:
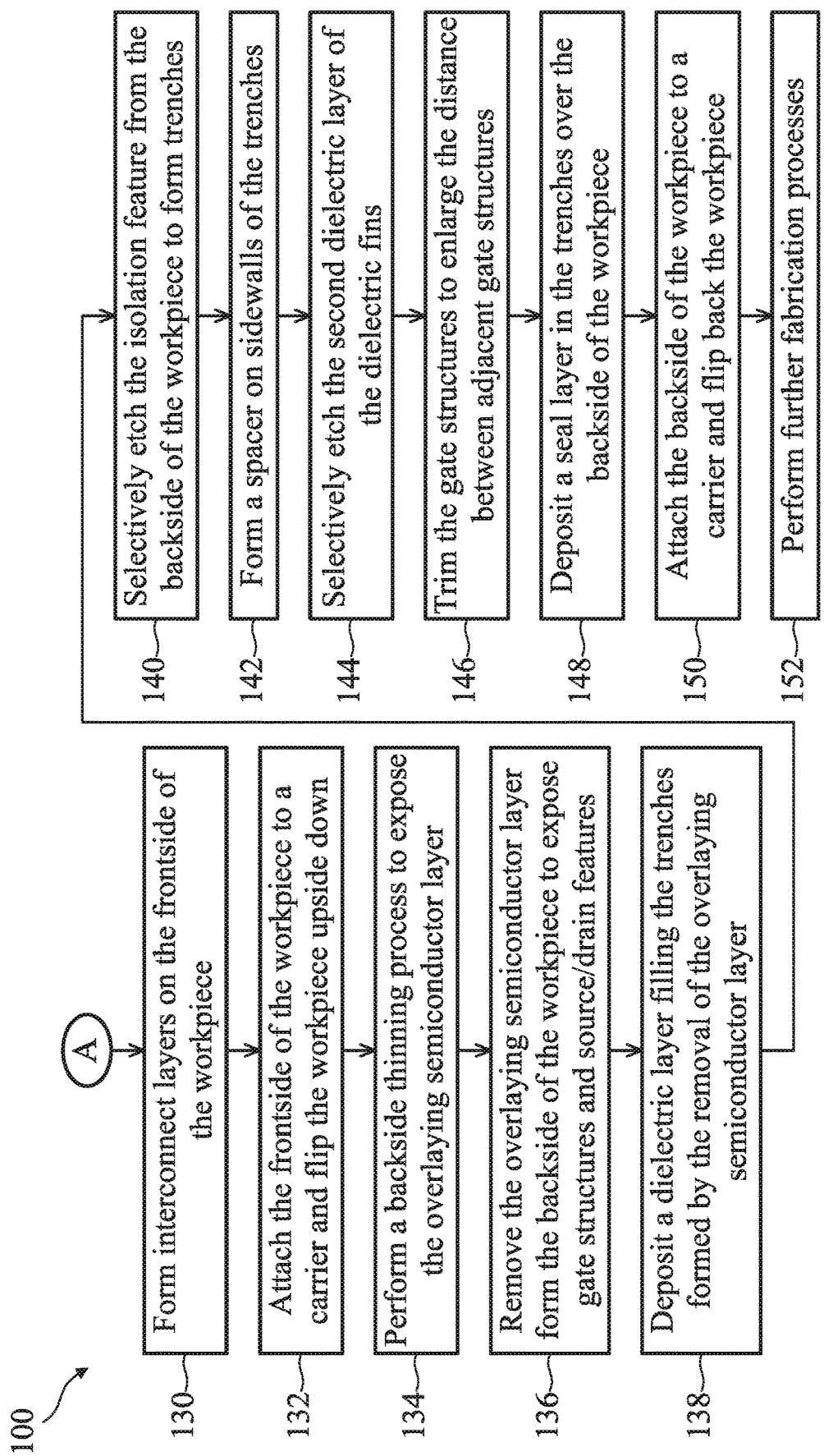

The various aspects of the present disclosure will now be described in more detail with reference to the figures. FIGS. 1A and 1B collectively illustrate a flowchart of a method 100 of forming a semiconductor device. The method 100 is merely an example and is not intended to limit the present disclosure to what is explicitly illustrated in the method 100. Additional steps may be provided before, during and after the method 100, and some steps described can be replaced, eliminated, or moved around for additional embodiments of the method. Not all steps are described herein in detail for reasons of simplicity. The method 100 is described below in conjunction with FIGS. 2A-32B, which illustrate fragmentary cross-sectional views of a workpiece 200 at different stages of fabrication according to embodiments of the method 100. Because a semiconductor device will be formed from the workpiece 200, the workpiece 200 may be referred to as a semiconductor device 200 or a device 200 as the context requires. For better illustration of various aspects of the present disclosure, each of the figures ending with the capital letter A illustrates a fragmentary cross-sectional view in a channel region (i.e., a cut in a Y-Z plane in a channel region along a lengthwise direction of gate structures and perpendicular to a lengthwise direction of channel members) of the to-be-formed transistor(s), each of the figures ending with the capital letter B illustrates a fragmentary cross-sectional view of a source/drain region (i.e., a cut in a Y-Z plane in a source region or a drain region that is perpendicular to the lengthwise direction of channel members) of the to-be-formed transistor(s). Throughout FIGS. 2A-32B, the X direction, the Y direction, and the Z direction are perpendicular to one another and are used consistently. Additionally, throughout the present disclosure, like reference numerals are used to denote like features. Embodiments of the present disclosure are described using an MBC transistor structure, which is for illustration purpose only and should not be construed as limiting the scope of the present disclosure; for example, the present disclosure may also be applicable to other multi-gate devices, including FinFET transistors.

Figure 2B:
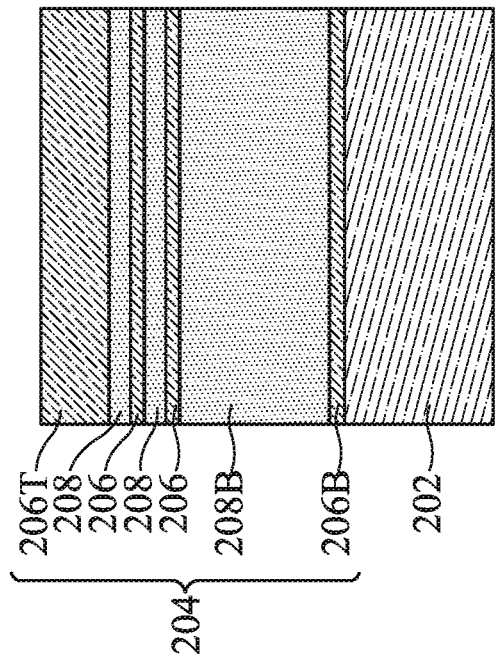
Figure 2A:
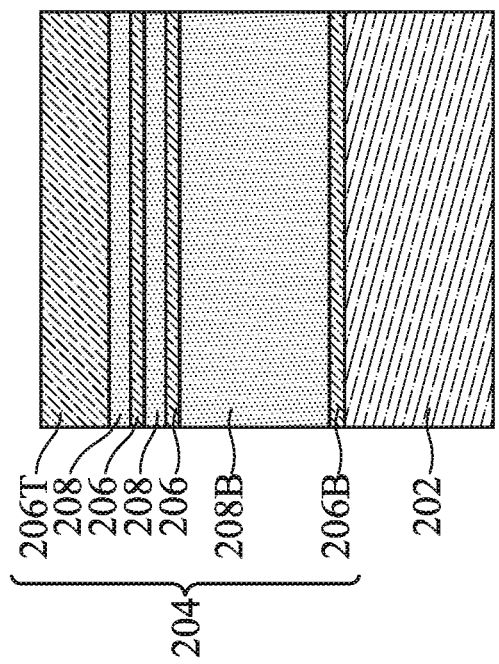

Referring to FIGS. 2A-2B, the method 100 includes a block 102 (FIG. 1A) where a workpiece 200 is received. The workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may include multiple n-type well regions and multiple p-type well regions. A p-type well region may be doped with a p-type dopant (i.e., boron (B)). An n-type well region may be doped with an n-type dopant (i.e., phosphorus (P) or arsenic (As)).

In some embodiments represented in FIGS. 2A-2B, the stack 204 may include a bottom sacrificial layer 206B over the substrate 202, an overlaying semiconductor layer 208B over the bottom sacrificial layer 206B, alternating channel layers 208 and sacrificial layers 206 over the bottom sacrificial layer 206B, and a top sacrificial layer 206T over the sacrificial layers 206 and the channel layers 208. The bottom sacrificial layer 206B, the overlaying semiconductor layer 208B, the top sacrificial layer 206T, the sacrificial layers 206, and the channel layers 208 may be deposited using an epitaxial process. Example epitaxial process may include vapor-phase epitaxy (VPE), ultra-high vacuum CVD (UHV-CVD)), molecular beam epitaxy (MBE), and/or other suitable processes. The channel layers 208 and the sacrificial layers 206 may have different semiconductor compositions. In some implementations, the channel layers 208 are formed of silicon (Si) and sacrificial layers 206 are formed of silicon germanium (SiGe). The additional germanium (Ge) content in the sacrificial layers 206 allow selective removal or recess of the sacrificial layers 206 without substantial damages to the channel layers 208. The sacrificial layers 206 and the channel layers 208 are disposed alternatingly such that the sacrificial layers 206 interleave the channel layers 208. FIGS. 2A-2B illustrate that two (2) layers of the sacrificial layers 206 and two (2) layers of the channel layers 208 are alternately and vertically arranged, which is for illustrative purposes only and not intended to be limiting beyond what is specifically recited in the claims. The number of layers depends on the desired number of channel members 208 for the semiconductor device 200. In some embodiments, the number of the channel layers 208 is between 1 and 6.

The bottom sacrificial layer 206B may be formed of silicon germanium (SiGe) or germanium (Ge). In one embodiment, a germanium content of the bottom sacrificial layer 206B may be the same as a germanium content of the sacrificial layer 206. In another embodiment, different from the sacrificial layers 206, a germanium content of the bottom sacrificial layer 206B may be larger than a germanium content of the sacrificial layers 206. For example, the germanium content of the sacrificial layers 206 may be between about 20% and about 30% in molar ratio and the germanium content of the bottom sacrificial layer 206B may be about 40% to about 60% in molar ratio. The bottom sacrificial layer 206B may be thicker than each of the sacrificial layers 206 along the Z direction. In some instances, each of the sacrificial layers 206 may have a thickness between about 4 nm and about 15 nm while the bottom sacrificial layer 206B may have a thickness between about 8 and about 30 nm. As will be described below, the bottom sacrificial layer 206B functions as an etch stop layer or a mechanical grinding stop layer in a device backside thinning process later on.

The overlaying semiconductor layer 208B and the substrate 202 may both include bulk single-crystalline silicon (Si). Alternatively, the overlaying semiconductor layer 208B and the substrate 202 may include the same or different semiconductor compositions, each of which may include but not limited to Si, Ge, SiGe, GaAs, InSb, GaP, GaSb, InAlAs, InGaAs, GaSbP, GaAsSb, InP, or combinations thereof.

Like the sacrificial layers 206, the top sacrificial layer 206T may be formed of silicon germanium (SiGe). In some instances, compositions of the sacrificial layers 206 and the top sacrificial layer 206T are substantially the same. The top sacrificial layer 206T may be thicker than the sacrificial layers 206 and functions to protect the stack 204 from damages during fabrication processes. In some instances, a thickness of the top sacrificial layer 206T may be between about nm and about 40 nm while a thickness of a sacrificial layer 206 may be between about 4 nm and about 15 nm.

Figure 3A:
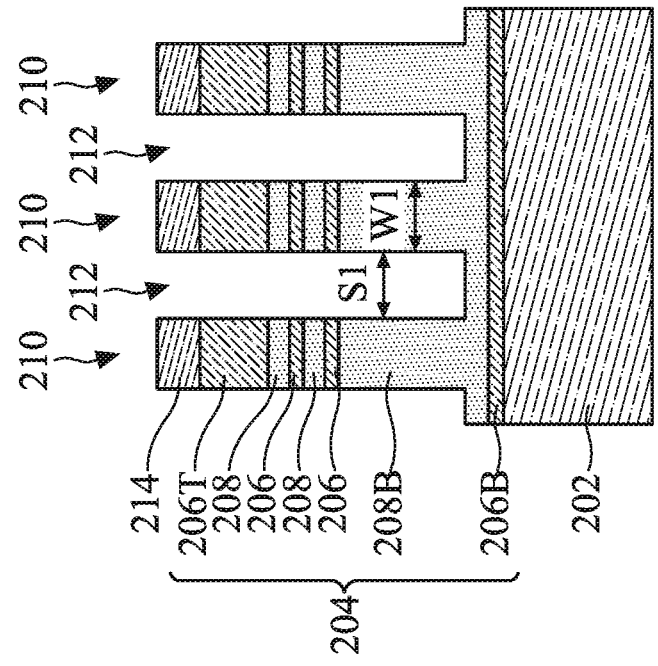
Figure 3B:
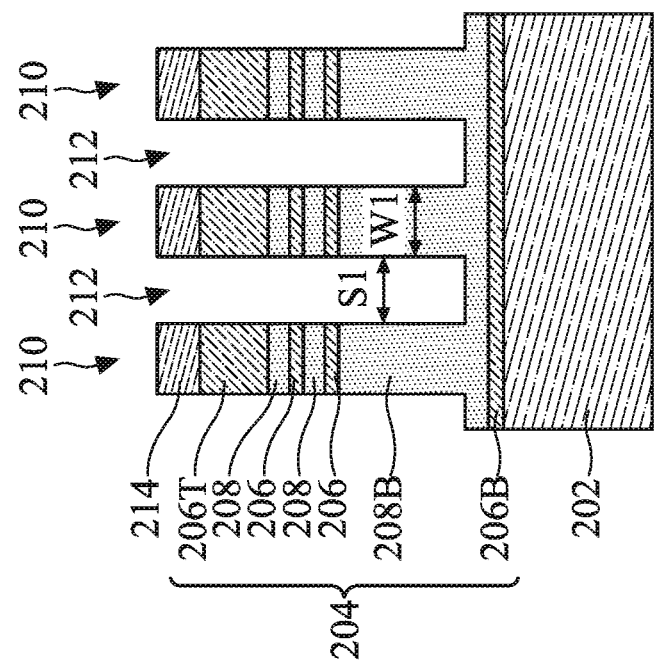

Referring to FIGS. 3A-3B, the method 100 includes a block 104 (FIG. 1A) where the stack 204 is patterned to form fin-shaped structures 210 separated by fin trenches 212. To pattern the stack 204, a hard mask layer 214 is deposited over the top sacrificial layer 206T. The hard mask layer 214 is then patterned to serve as an etch mask to pattern the top sacrificial layer 206T, the interleaved sacrificial layers 206 and channel layers 208, and a top portion of the overlaying semiconductor layer 208B. In some embodiments, the hard mask layer 214 may be deposited using CVD, plasma-enhanced CVD (PECVD), atomic layer deposition (ALD), plasma-enhanced ALD (PEALD), or a suitable deposition method. The hard mask layer 214 may be a single layer or a multi-layer. When the hard mask layer 214 is a multi-layer, the hard mask layer 214 may include a pad oxide and a pad nitride layer. In an alternative embodiment, the hard mask layer 214 may include silicon (Si). The fin-shaped structures 210 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the hard mask layer 214 and then the patterned hard mask layer 214 may be used as an etch mask to etch the stack 204 to form fin-shaped structures 210. The etching process can include dry etching, wet etching, reactive ion etching (RIE), and/or other suitable processes.

As shown in FIGS. 3A-3B, the fin-shaped structures 210 extend lengthwise along the X direction and extend vertically along the Z direction from the substrate 202. Along the Y direction, the fin-shaped structures 210 are separated by fin trenches 212. Each of the fin trenches 212 may define the same or different spacings between adjacent fin-shaped structures 210. The fin trenches 212 define a spacing S1. In some instances, the spacing S1 is between about 22 nm and about 30 nm. The fin-shaped structure 210 has a width W1. In some instances, the width W1 is between about 10 nm and about 50 nm.

Figure 4A:
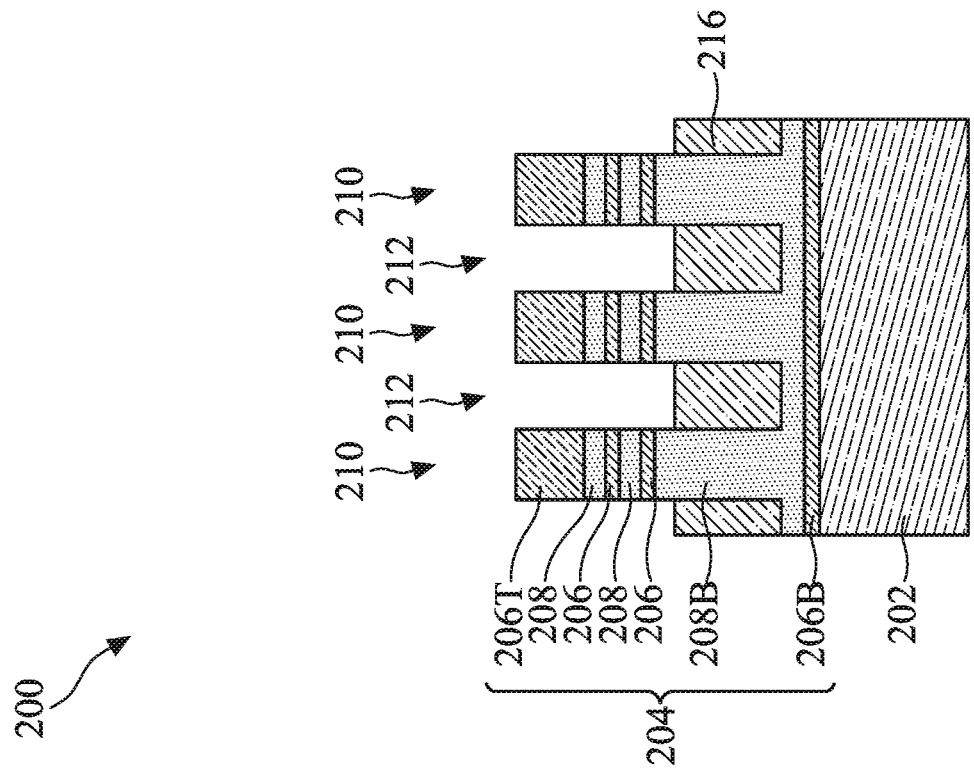
Figure 4B:
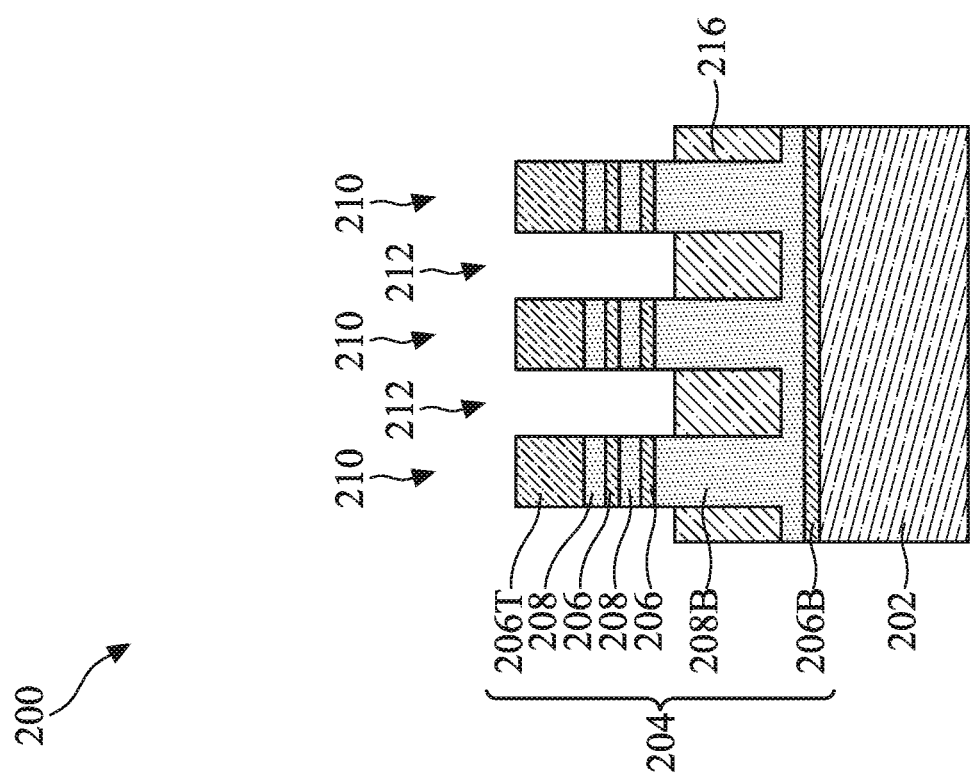

Referring to FIGS. 4A-4B, the method 100 includes a block 106 (FIG. 1A) where an isolation feature 216 is formed in the fin trenches 212. The isolation feature 216 may be referred to as a shallow trench isolation (STI) feature 216. In an example process to form the isolation feature 216, a dielectric material is deposited over the workpiece 200, filling the fin trenches 212 with the dielectric material. In some embodiments, the dielectric material may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various examples, at block 106, the dielectric material may be deposited by flowable CVD (FCVD), spin-on coating, and/or other suitable process. The deposited dielectric material is then thinned and planarized, for example by a chemical mechanical polishing (CMP) process, until the hard mask layer 214 is exposed. After the planarization, the deposited dielectric material is recessed in an etching-back process until the top portions of the fin-shaped structures 210, particularly the sacrificial layers 206 and the channel layers 208, rise above the isolation feature 216. The hard mask layer 214 may also be removed in the etching-back process. In the illustrated embodiment, a top portion of the overlaying semiconductor layer 208B may also rise above the isolation feature 216, as shown in FIGS. 4A-4B. At this point, a bottom portion of the fin-shaped structures 210 are surrounded by the isolation features 216. The isolation feature 216 reduces the depths of the fin trenches 212.

Figure 5A:
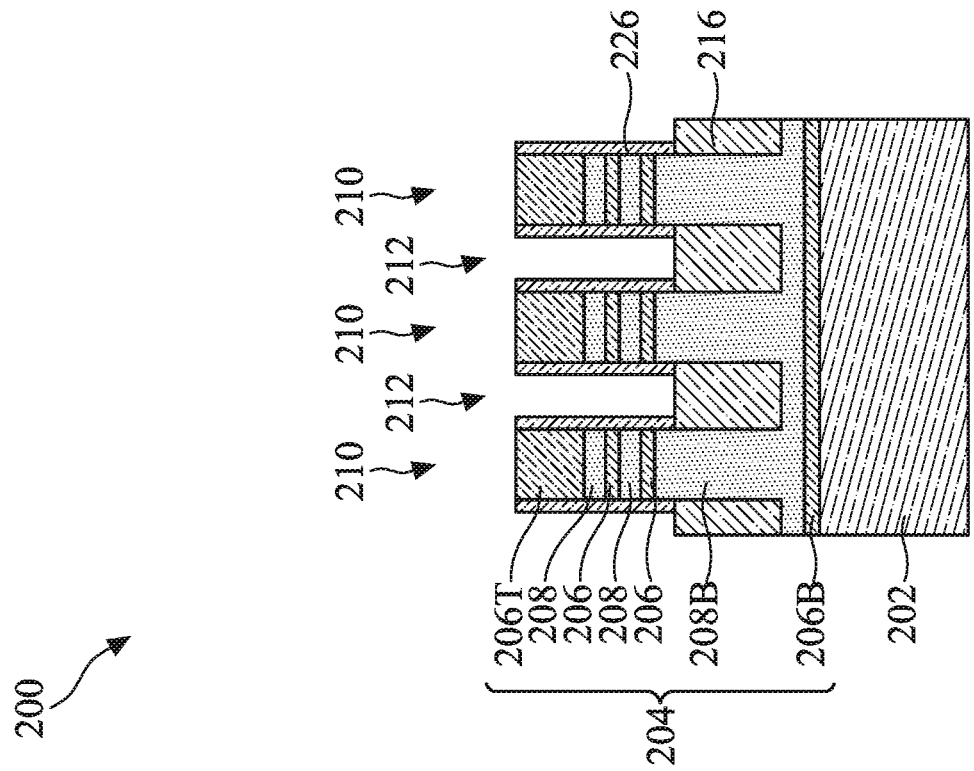
Figure 5B:
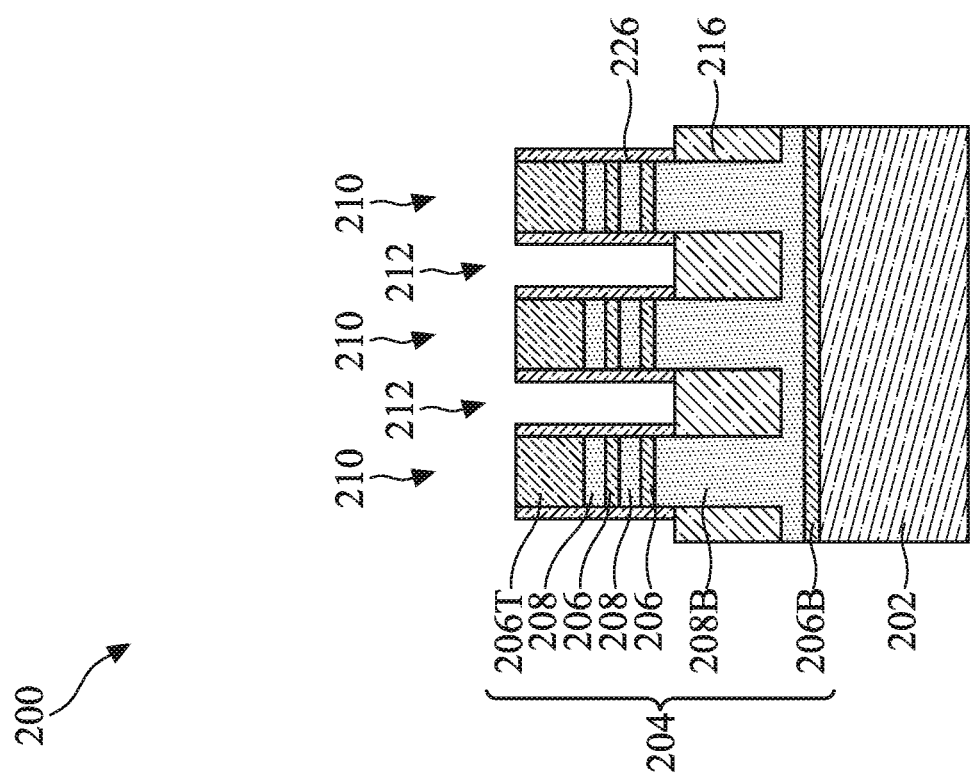
Figure 6B:
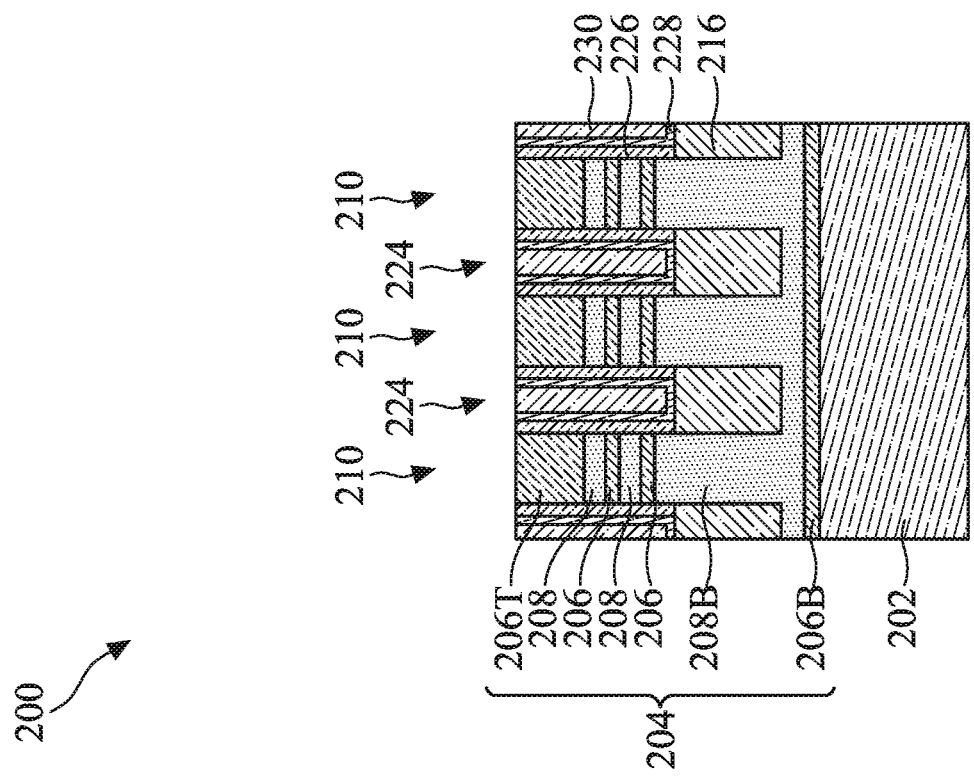
Figure 6A:
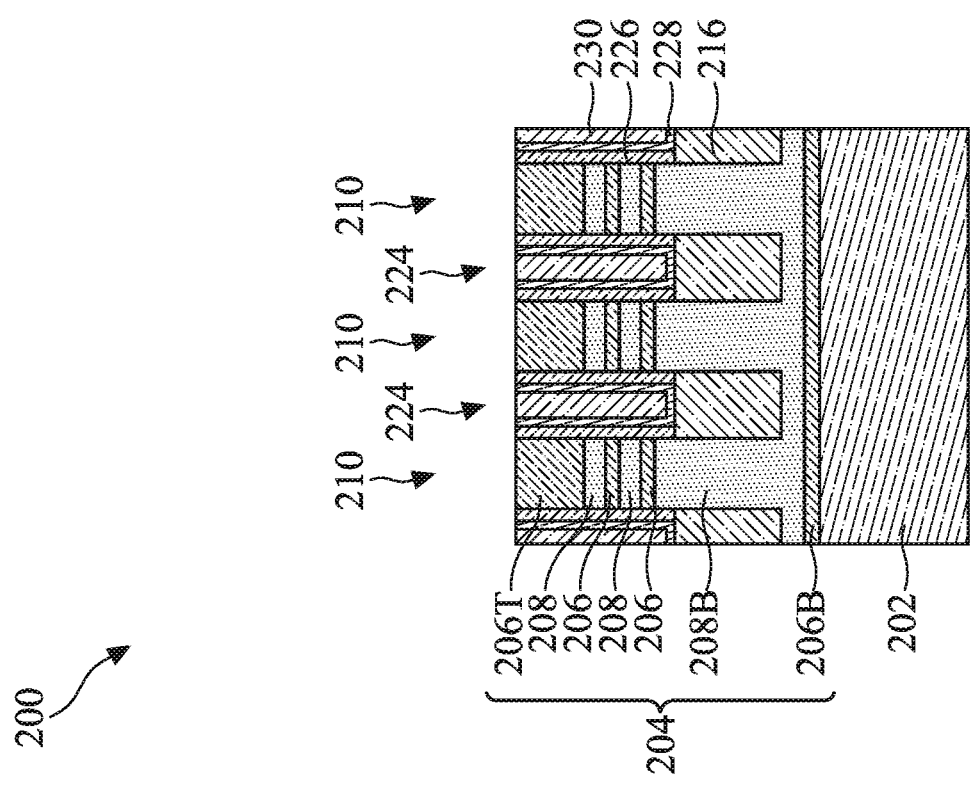

Referring to FIGS. 5A and 5B, the method 100 includes a block 108 (FIG. 1A) where a cladding layer 226 is deposited on sidewalls of the fin-shaped structures 210. In some embodiments, the cladding layer 226 may have a composition similar to that of the sacrificial layers 206 or the top sacrificial layer 206T. In one example, the cladding layer 226 may be formed of silicon germanium (SiGe). Their common composition allows selective and simultaneous removal of the sacrificial layers 206 and the cladding layer 226 in a subsequent etching process. In some embodiments, the cladding layer 226 may be conformally and epitaxially grown as a blanket layer on the workpiece 200 using vapor phase epitaxy (VPE) or molecular beam epitaxy (MBE). Depending on the extent of the selective growth of the cladding layer 226, an etching-back process may be performed to expose the isolation feature 216.

Referring to FIGS. 6A-6B and 7A-7B, the method 100 includes a block 110 (FIG. 1A) where dielectric fins 224 are formed in the fin trenches 212. An example process to form the dielectric fin 224 includes conformally depositing a first dielectric layer 228 and subsequently depositing a second dielectric layer 230 into the fin trenches 212. The second dielectric layer 230 is surrounded by the first dielectric layer 228. The first dielectric layer 228 may be conformally deposited using CVD, ALD, or a suitable method. The first dielectric layer 228 lines the sidewalls and the bottom surfaces of the fin trenches 212. The second dielectric layer 230 is then deposited over the first dielectric layer 228 using CVD, high density plasma CVD (HDPCVD), and/or other suitable process. In some instances, a dielectric constant of the second dielectric layer 230 is smaller than that of the first dielectric layer 228. The first dielectric layer 228 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. In one embodiment, the first dielectric layer 228 includes aluminum oxide. The second dielectric layer 230 may include silicon oxide, silicon carbide, silicon oxynitride, silicon oxycarbonitride, or a suitable dielectric material. In one embodiment, the second dielectric layer 230 includes silicon oxide.

Operations at the block 110 may etch back the dielectric layers 228 and 230 to expose again a top portion of the fin trenches 212. The etch back process may include a dry etching process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Subsequently, a third dielectric layer 232 is deposited above the dielectric layers 228 and 230 using CVD, high density plasma CVD (HDPCVD), and/or other suitable process. The third dielectric layer 232 includes a high-K dielectric material (e.g., k>7) and is also referred to as the high-K dielectric layer 232. In some embodiments, the high-K dielectric layer 232 may include hafnium oxide ($HfO_2$), zirconium oxide ($ZrO_2$), hafnium aluminum oxide ($HfAlO_x$), hafnium silicate (Hf-SiOx), aluminum oxide ($Al_2O_3$), or other suitable high-K dielectric material. After the deposition of the dielectric layer 232, the workpiece 200 is planarized using a chemical mechanical polishing (CMP) process to expose the top sacrificial layer 206T. As shown in FIGS. 7A-7B, upon conclusion of the CMP process, the dielectric layers 228, 230, and 232 collectively define the dielectric fins 224 in the fin trenches 212.

Referring to FIGS. 8A-8B, the method 100 includes a block 112 (FIG. 1A) where the top sacrificial layer 206T in the fin-shaped structures 210 are removed. At the block 112, the workpiece 200 is etched to selectively remove the top sacrificial layer 206T and a portion of the cladding layer 226 to expose the topmost channel layer 208, without substantially damaging the dielectric fins 224. In some instances, because the top sacrificial layer 206T and the cladding layer 226 are formed of silicon germanium (SiGe), the etching process at the block 112 may be selective to silicon germanium (SiGe). For example, the cladding layer 226 and the top sacrificial layer 206T may be etched using a selective wet etching process that includes ammonium hydroxide ($NH_4OH$), hydrogen fluoride (HF), hydrogen peroxide ($H_2O_2$), or a combination thereof. After the removal of the top sacrificial layer 206T and a portion of the cladding layer 226, the dielectric fins 224, particularly the third dielectric layer 232, rise above the topmost channel layer 208.

Figures 9A, 9B:
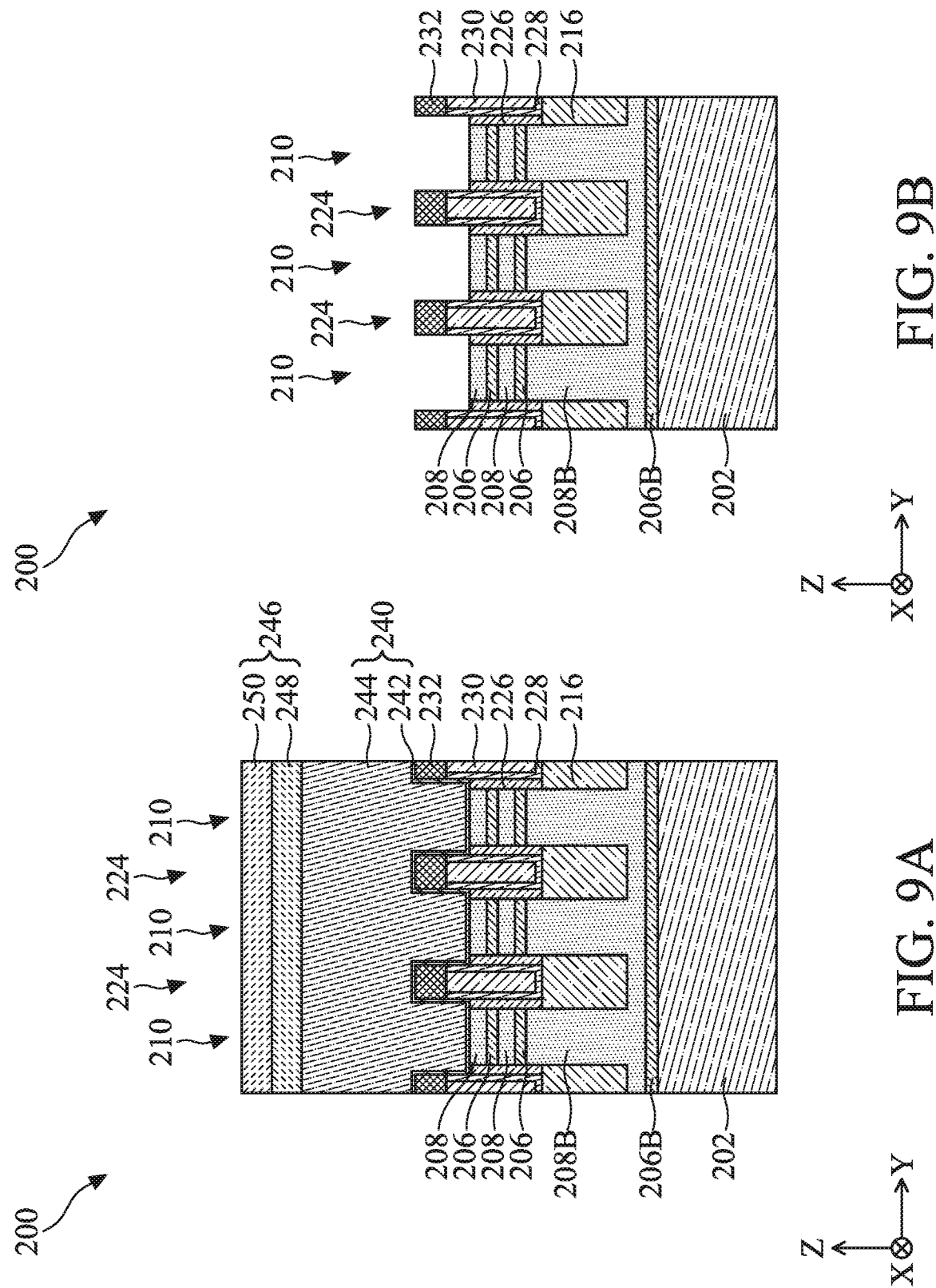

Referring to FIGS. 9A-9B, the method 100 includes a block 114 (FIG. 1A) where dummy gate stacks 240 are formed over the channel regions of the fin-shaped structures 210. In some embodiments, a gate replacement process (or gate-last process) is adopted where the dummy gate stacks 240 serve as a placeholder for functional gate structures. Other processes and configuration are possible. In the illustrated embodiment, the dummy gate stack 240 includes a dummy dielectric layer 242 and a dummy electrode 244 disposed over the dummy dielectric layer 242. For patterning purposes, a gate top hard mask 246 is deposited over the dummy gate stacks 240. The gate top hard mask 246 may be a multi-layer and include a silicon nitride mask layer 248 and a silicon oxide mask layer 250 over the silicon nitride mask layer 248. The regions of the fin-shaped structures 210 underlying the dummy gate stacks 240 may be referred to as channel regions. Each of the channel regions in a fin-shaped structure 210 is sandwiched between two source/drain regions for source/drain formation. In an example process, the dummy dielectric layer 242 is blanketly deposited over the workpiece 200 by CVD. A material layer for the dummy electrode 244 is then blanketly deposited over the dummy dielectric layer 242. The dummy dielectric layer 242 and the material layer for the dummy electrode 244 are then patterned using photolithography processes to form the dummy gate stacks 240. In some embodiments, the dummy dielectric layer 242 may include silicon oxide and the dummy electrode 244 may include polycrystalline silicon (poly silicon).

Figure 10A:
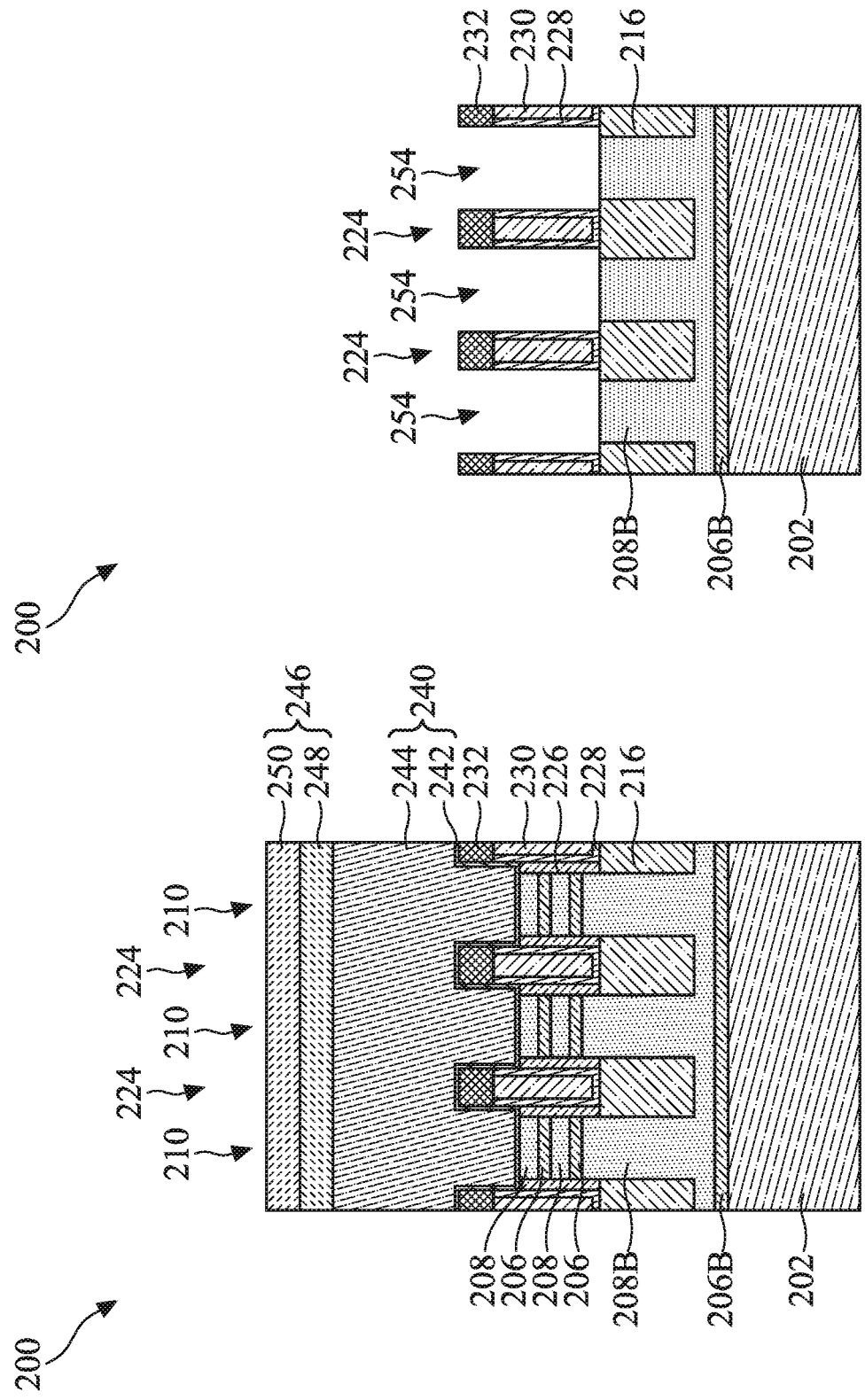
Figure 10B:

Referring to FIGS. 10A-10B, the method 100 includes a block 116 (FIG. 1A) where the source/drain regions of the fin-shaped structures 210 are recessed to form source recesses and drain recesses, collectively as source/drain recesses 254 (or source/drain trenches 254). With the dummy gate stack 240 serving as an etch mask, the workpiece 200 is anisotropically etched to form the source/drain recesses 254 over the source/drain regions of the fin-shaped structures 210. In the illustrated embodiment, operations at the block 118 remove the sacrificial layers 206, the channel layers 208, the cladding layer 226, as well as a top portion of the overlaying semiconductor layer 208B from the source/drain regions, thereby exposing the isolation feature 216. In some embodiments, the source/drain recesses 254 may extend into the overlaying semiconductor layer 208B and be below a top surface of the isolation feature 216. The anisotropic etch at the block 118 may include a dry etching process. For example, the dry etching process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figures 11A, 11B:
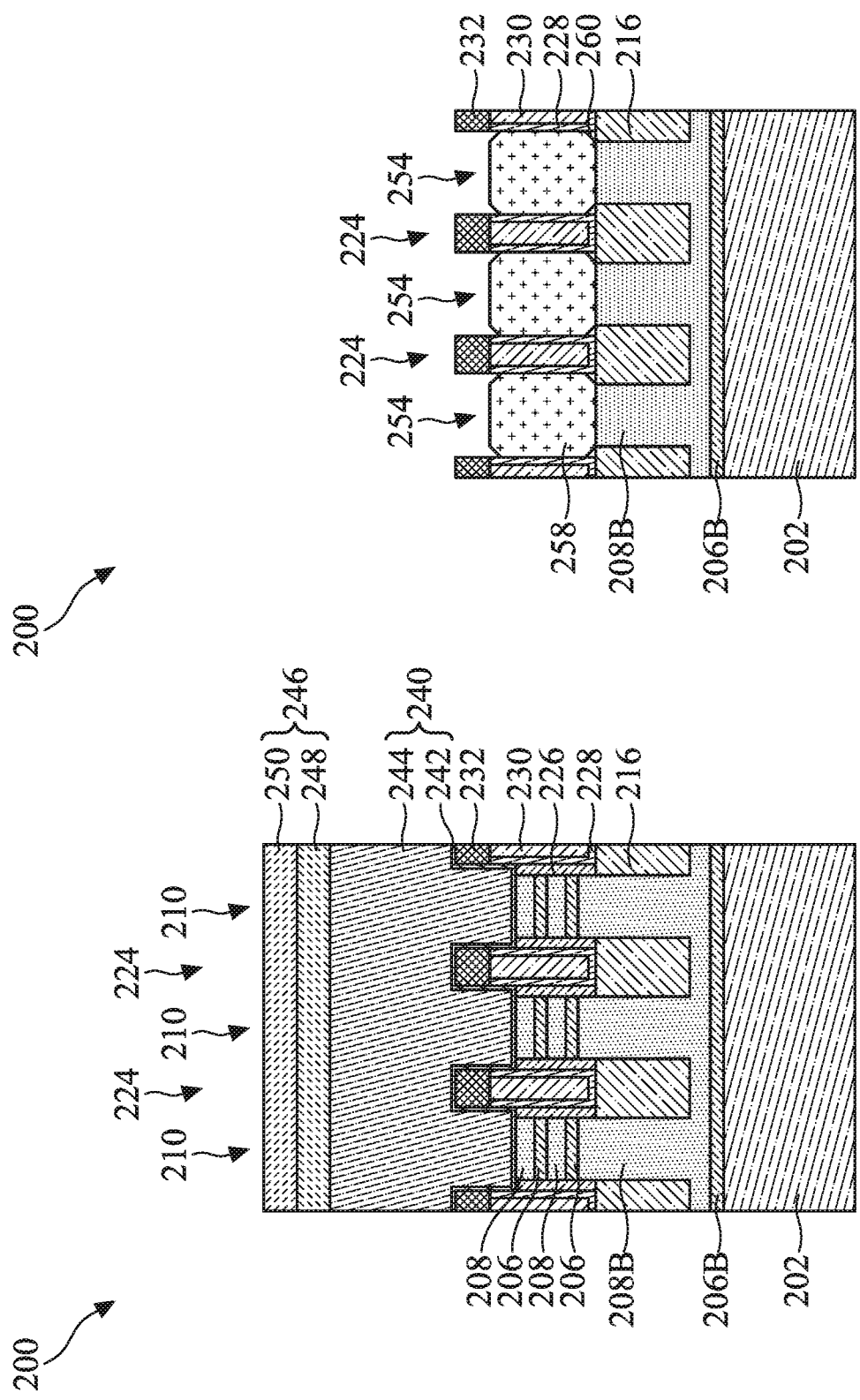
Figures 12A, 12B:
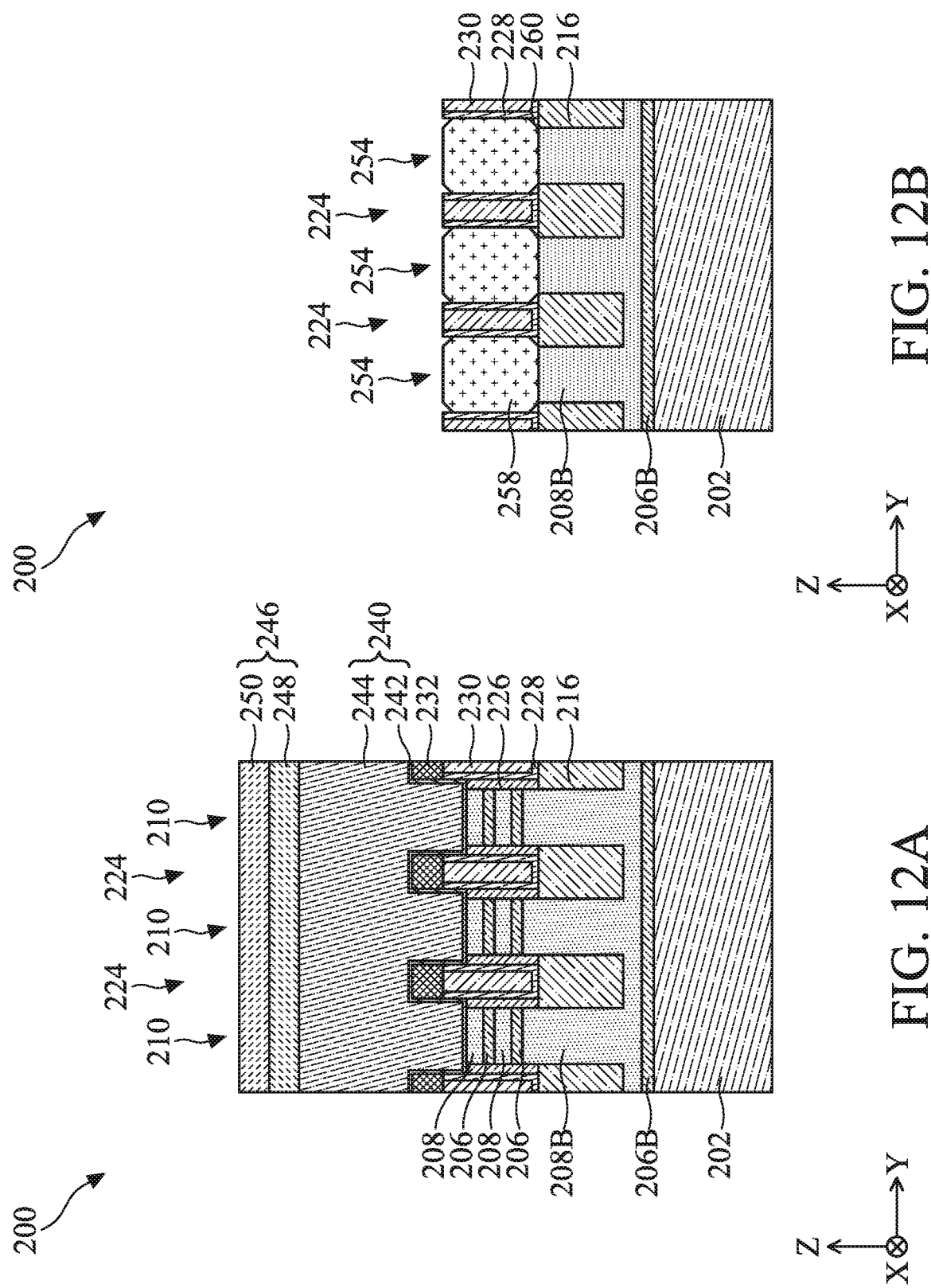
Figures 14A, 14B:
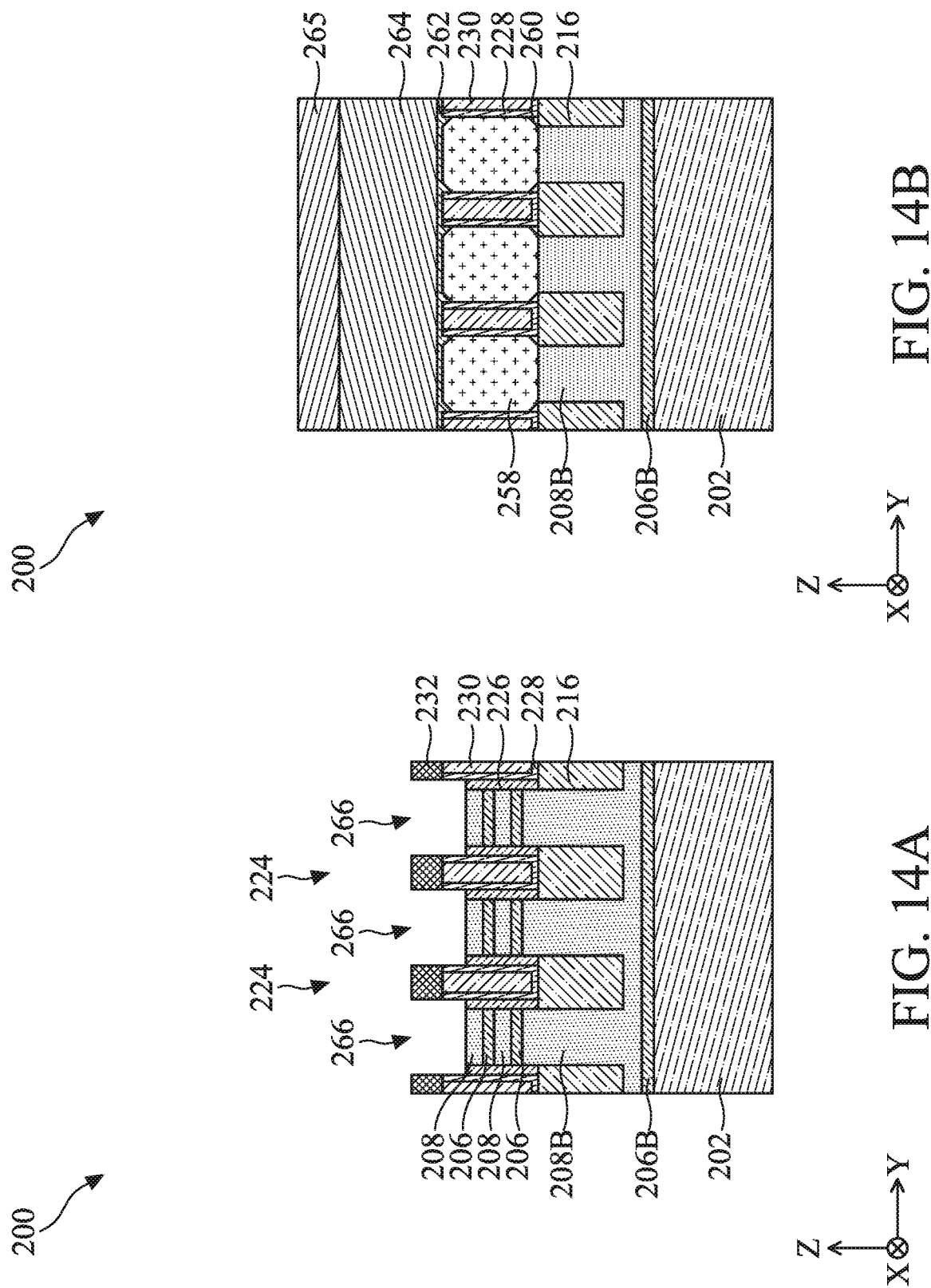

Referring to FIGS. 11A-11B, the method 100 includes a block 118 where source/drain features 258 are formed. The source/drain features 258 are selectively and epitaxially deposited on the exposed semiconductor surfaces of the overlaying semiconductor layer 208B in the source/drain recesses 254. The source/drain features 258 may be deposited using an epitaxial process, such as vapor-phase epitaxy (VPE), ultra-high vacuum CVD (UHV-CVD), molecular beam epitaxy (MBE), and/or other suitable processes. Depending on the design of the workpiece 200, the source/drain features 258 may be n-type or p-type. When the source/drain features 258 are n-type, they may include silicon (Si) doped with an n-type dopant, such as phosphorus (P) or arsenic (As). When the source/drain features 258 are p-type, they may include silicon germanium (SiGe) doped with a p-type dopant, such as boron (B) or gallium (Ga). Doping of the source/drain features 258 may be performed either in situ with their deposition or ex situ using an implantation process, such as a junction implant process. Also as shown in FIG. 11B, at the step region of the sidewalls of the source/drain recesses 254, facets of the source/drain features 258 may trap voids 260 between the source/drain features 258 and dielectric features, such as the dielectric fins 224 and the isolation feature 216. After the forming of the source/drain features 258, operations at the block 118 may perform an etch back process to remove the third dielectric layer 232 from the dielectric fins 224 in the source/drain regions, as illustrated in FIGS. 12A-12B.

Referring to FIGS. 13A-13B, the method 100 includes a block 120 (FIG. 1A) where a contact etch stop layer (CESL) 262 and an interlayer dielectric (ILD) 264 layer are deposited on the frontside of the workpiece 200. In an example process, the CESL 262 is first conformally deposited over the workpiece 200 and then the ILD layer 264 is blanketly deposited over the CESL 262. The CESL 262 may include silicon nitride, silicon oxide, silicon oxynitride, and/or other materials known in the art. The CESL 262 may be deposited using ALD, plasma-enhanced chemical vapor deposition (PECVD) process and/or other suitable deposition or oxidation processes. In some embodiments, the ILD layer 264 includes materials such as SiCN, SiON, SiOCN, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 264 may be deposited by spin-on coating, an FCVD process, or other suitable deposition technique. In some embodiments, after formation of the ILD layer 264, the workpiece 200 may be annealed to improve integrity of the ILD layer 264. In the illustrated embodiment, operations at the block 120 further deposit an additional dielectric layer 265 over the ILD layer 264. The additional dielectric layer 265 may include different material composition form the ILD layer 264. In some instances, the additional dielectric layer 265 includes SiCN, SiON, SiOCN, or other suitable dielectric material. To remove excess materials (including the gate top hard mask 246) and to expose top surfaces of the dummy electrode 244 of the dummy gate stacks 240, a planarization process (such as a CMP process) may be performed to the workpiece 200 to provide a planar top surface. Top surfaces of the dummy electrodes 244 are exposed on the planar top surface.

Referring to FIGS. 14A-14B and 15A-15B, the method 100 includes a block 122 (FIG. 1A) where the dummy gate stacks 240 and the sacrificial layers 206 are selectively removed. The dummy gate stacks 240 exposed at the conclusion of the block 120 are removed from the workpiece 200 by a selective etching process. The selective etching process may be a selective wet etching process, a selective dry etching process, or a combination thereof. In the depicted embodiment, the selective etching process selectively removes the dummy dielectric layer 242 and the dummy electrode 244 without substantially damaging the channel layers 208 and the gate spacers 252. The removal of the dummy gate stacks 240 results in gate trenches 266 over the channel regions. After the removal of the dummy gate stacks 240, the channel layers 208, the sacrificial layers 206, and the cladding layer 226 in the channel regions are exposed in the gate trenches 266. Subsequently, operations at the block 122 selectively removes the sacrificial layers 206 and the cladding layer 226 from the gate trenches 266 to release the channel layers 208, as illustrated in FIGS. 15A-15B. The released channel layers 208 at the conclusion of the block 128 are also denoted as the channel members 208. In the depicted embodiment where the channel members 208 resemble a sheet or a nanosheet, the channel member release process may also be referred to as a sheet formation process. The channel members 208 are vertically stacked along the Z direction. All channel members 208 are spaced apart from the dielectric fins 224 for a distance reserved by the cladding layer 226. The selective removal of the sacrificial layers 206 and the cladding layer 226 may be implemented by selective dry etching, selective wet etching, or other selective etching processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. With the removal of the sacrificial layers 206 and the cladding layer 226 from the channel regions, the dielectric fins 224, the channel members 208, the top surface of the overlaying semiconductor layer 208B, and the isolation feature 216 are exposed in the gate trenches 266.

Figures 16A, 16B:
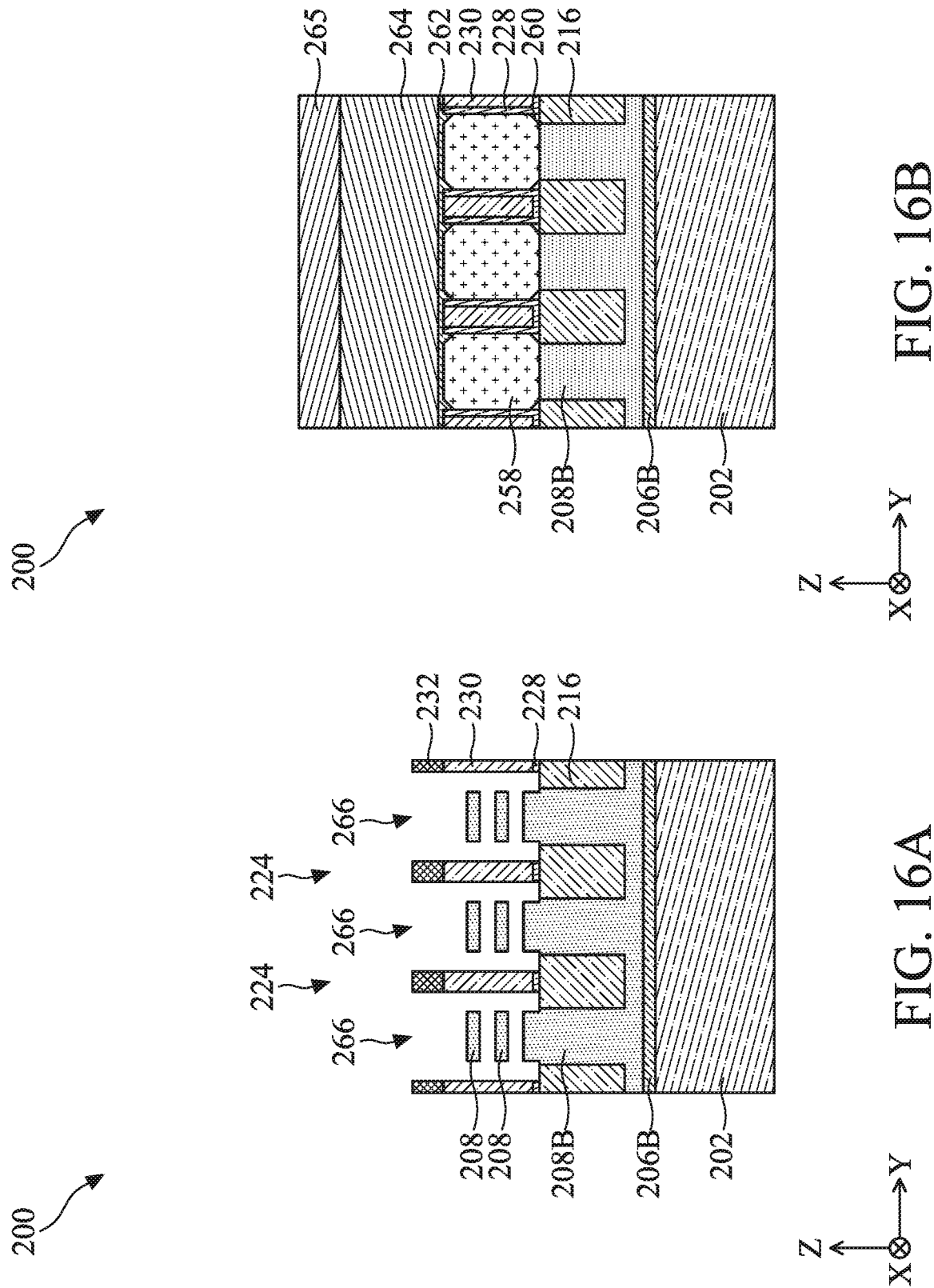

Referring to FIGS. 16A-16B, the method 100 includes a block 124 (FIG. 1A) where the dielectric fins 224 are thinned down in width by selectively removing outer dielectric layers—the first dielectric layer 228—from sidewalls of the second dielectric layer 230. The thinning of the dielectric fins 224 provides a larger gate trench volume which in turn facilitates the deposition of various dielectric and metallic layers in the to-be-formed functional gate structures. The first dielectric layer 228 exposed in the gate trenches 266 are removed from the channel regions by a selective etching process. The selective etching process may be a selective wet etching process, a selective dry etching process, or a combination thereof. In the depicted embodiments, the selective etching process selectively removes the first dielectric layer 228 without substantially damaging the second dielectric layer 230. In some instances, the third dielectric layer 232 also have some etching loss such that a width of the third dielectric layer 232 becomes smaller than the second dielectric layer 230 thereunder. As shown in FIG.

16A, some portions of the first dielectric layer 228 sandwiched between the second dielectric layer 230 and the isolation feature 216 may remain due to their less exposed area for etchant(s) and accordingly smaller etching rate.

Referring to FIGS. 17A-17B and 18A-18B, the method 100 includes a block 126 (FIG. 1A) where gate structures 270 (also known as functional gate structures 270 or metal gate structures 270) are formed in the gate trenches 266 to engage each of the channel members 208. Each of the gate structures 270 includes an interfacial layer 271 disposed on the channel members 208, a high-k dielectric layer 272 disposed on the interfacial layer 271, and a gate electrode layer 274 over the gate dielectric layer 272. The interfacial layer 271 and the high-k dielectric layer 272 are collectively referred to as a gate dielectric layer. The interfacial layer 271 may include silicon oxide and be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed semiconductive surfaces of the channel members 208 and exposed semiconductive surfaces of the overlaying semiconductor layer 208B to form the interfacial layer. That is, the exposed dielectric surfaces of the isolation feature 216 may be not covered by the interfacial layer 271. The high-k dielectric layer 272 is then deposited over the interfacial layer 271 using ALD, CVD, and/or other suitable methods. The high-k dielectric layer 272 also covers the exposed surfaces of the isolation feature 216. The high-k dielectric layer 272 includes high-K dielectric materials. In one embodiment, the high-k dielectric layer 272 may include hafnium oxide. Alternatively, the high-k dielectric layer 272 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material.

After the formation of the high-k dielectric layer 272, the gate electrode layer 274 is deposited over the high-k dielectric layer 272, as illustrated in FIGS. 18A-18B. The gate electrode layer 274 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 274 may be formed by ALD, PVD, CVD, e-beam evaporation, or other suitable process. Although not explicitly shown in the figures, the gate structures 270 are deposited as a joint gate structure and then etched back until the dielectric fins 224 separate the joint gate structure into the gate structures 270 that are separated apart from each other. The dielectric fins 224 also provide electrical isolation between neighboring gate structures 270. The etching back of the gate structures 270 may include a selective wet etching process that uses nitric acid, hydrochloric acid, sulfuric acid, ammonium hydroxide, hydrogen peroxide, or a combination thereof. In the depicted embodiment, each of the channel members 208 is wrapped around by a respective gate structure 270. At the conclusion of the block 128, the protruding portions of the dielectric fins 224, particularly the third dielectric layer 232, may be etched back in the channel regions, as illustrated in FIGS. 19A-19B. Alternatively, the third dielectric layer 232 may be removed in a planarization process (such as a CMP process), such that top surfaces of the dielectric fins 224 are coplanar with the top surfaces of the gate structures 270.

Figure 20B:
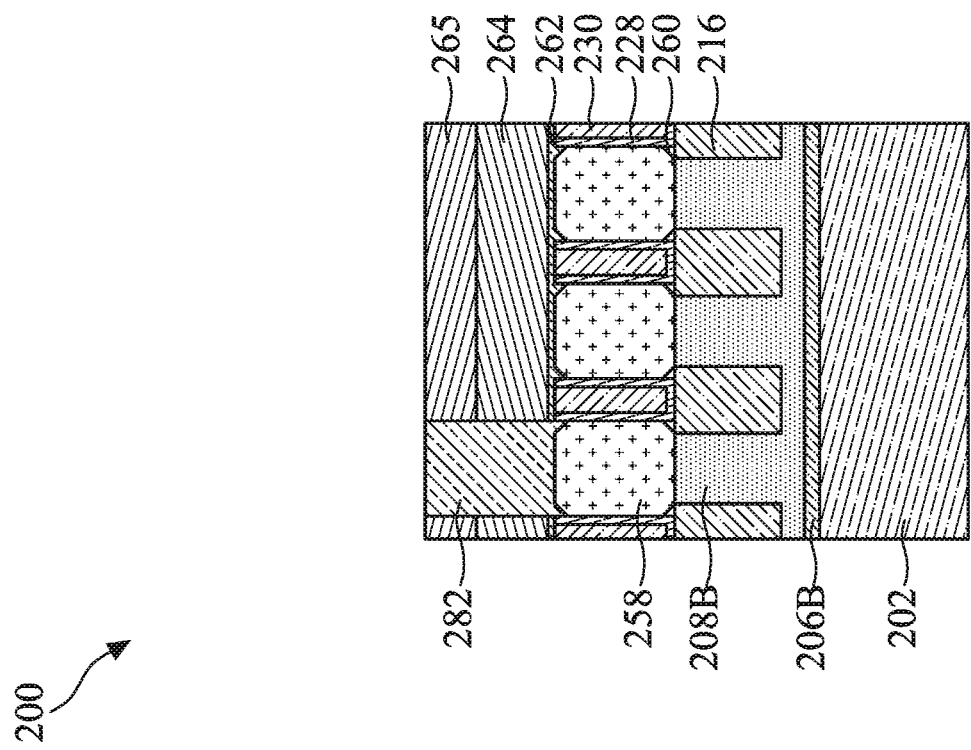
Figure 20A:
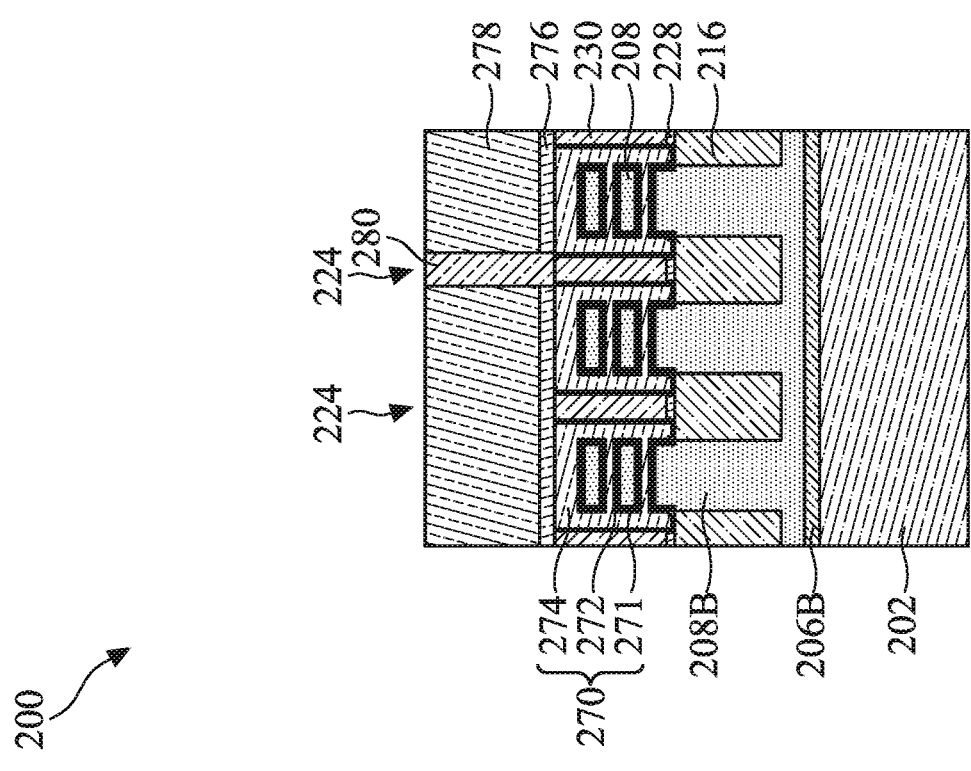

Referring to FIGS. 20A-20B, the method 100 includes a block 128 (FIG. 1A) where a metal cap layer 276, a self-aligned cap (SAC) layer 278, a gate cut feature 280, and a source/drain contact 282 are formed in the frontside of the workpiece 200. In some embodiments, the metal cap layer 276 may include titanium (Ti), titanium nitride (TiN), tantalum nitride (TaN), tungsten (W), ruthenium (Ru), cobalt (Co), or nickel (Ni) and may be deposited using PVD, CVD, or metal organic chemical vapor deposition (MOCVD). In one embodiment, the metal cap layer 276 includes tungsten (W), such as fluorine-free tungsten (FFW), and is deposited by PVD. The metal cap layer 276 electrically connects the gate structures 270. After the deposition of the metal cap layer 276, the SAC layer 278 is deposited over the workpiece 200 by CVD, PECVD, or a suitable deposition process. The SAC layer 278 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Photolithography processes and etching processes are then performed to etch the deposited SAC layer 278 to form gate cut openings to expose the top surfaces of the dielectric fins. Thereafter, a dielectric material is deposited and planarized by a CMP process to form the gate cut feature 280 in the gate cut openings. The dielectric material for the gate cut feature 280 may be deposited using HDPCVD, CVD, ALD, or a suitable deposition technique. In some instances, the gate cut feature 280 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In some embodiments, the gate cut features 280 and the SAC layer 278 may have different compositions to introduce etch selectivity. The gate cut feature 280 and the corresponding dielectric fin 224 directly thereunder collectively separate the metal cap layer 276 into segments. In the depicted embodiment, the two gate structures 270 on the left remain electrically connected by the metal cap layer 276; yet the one gate structure 270 on the right is isolated from the two gate structures 270 on the left. The S/D contact 282 may include tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), or a combination thereof, and may be deposited using PVD, CVD, or metal organic chemical vapor deposition (MOCVD). The workpiece 200 may also include a silicide feature (not depicted) between the S/D contact 282 and the S/D feature 258 to further reduce contact resistance. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. Alternatively, the silicide formation may be skipped and the S/D contact 282 directly contacts the S/D feature 258.

Referring to FIGS. 21A-21B, the method 100 includes a block 130 (FIG. 1B) where one or more frontside middle-end-of-line (MEOL) and frontside back-end-of-line (BEOL) processes are performed to form one or more interconnect layers with contacts, vias, and metal lines (also known as metal wiring layers) embedded in dielectric layers. In some embodiments, operations at the block 130 include forming gate contacts 286, intermetal dielectric (IMD) layers 288, metal lines and intermetal vias 290 in dielectric layers of the IMD layers 288, contact pads, etc. The workpiece 200 may further include passivation layers and/or other layers built on the frontside of the workpiece 200. These layers and the one or more interconnect layers connect gate, source, and drain electrodes of various transistors, as well as other circuits in the workpiece 200, to form an integrated circuit in part or in whole.

Figures 22A, 22B:
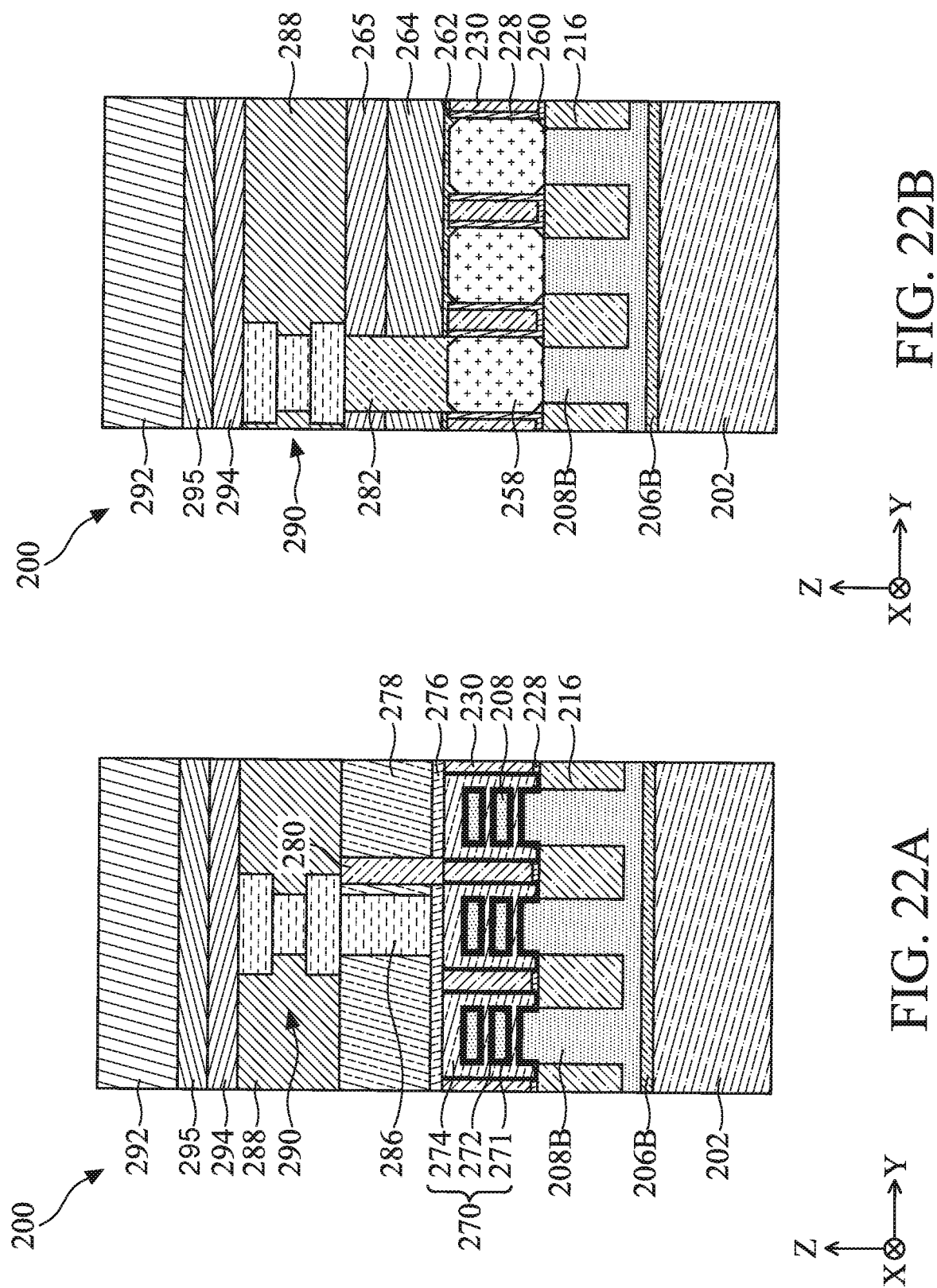

Still referring to FIGS. 22A-22C, the method 100 includes a block 132 (FIG. 1B) where a carrier 292 is attached to the frontside of the workpiece 200. The carrier 292 may be a silicon wafer in some embodiments. Operations at the block 138 may use any suitable attaching processes, such as direct bonding, hybrid bonding, using adhesive, or other bonding methods. In the illustrated embodiment, a bonding oxide layer 294 and an adhesive layer 295 is formed on the frontside of the workpiece 200 and adjoins the carrier 292 to the frontside of the workpiece 200. Operations at the block 132 may further include alignment, annealing, and/or other processes. The attaching of the carrier 292 allows the workpiece 200 to be flipped upside down. This makes the workpiece 200 accessible from the backside of the workpiece 200 for further processing. It is noted that the workpiece 200 is flipped upside down in following FIGS. 23A-31B.

Figure 23B:
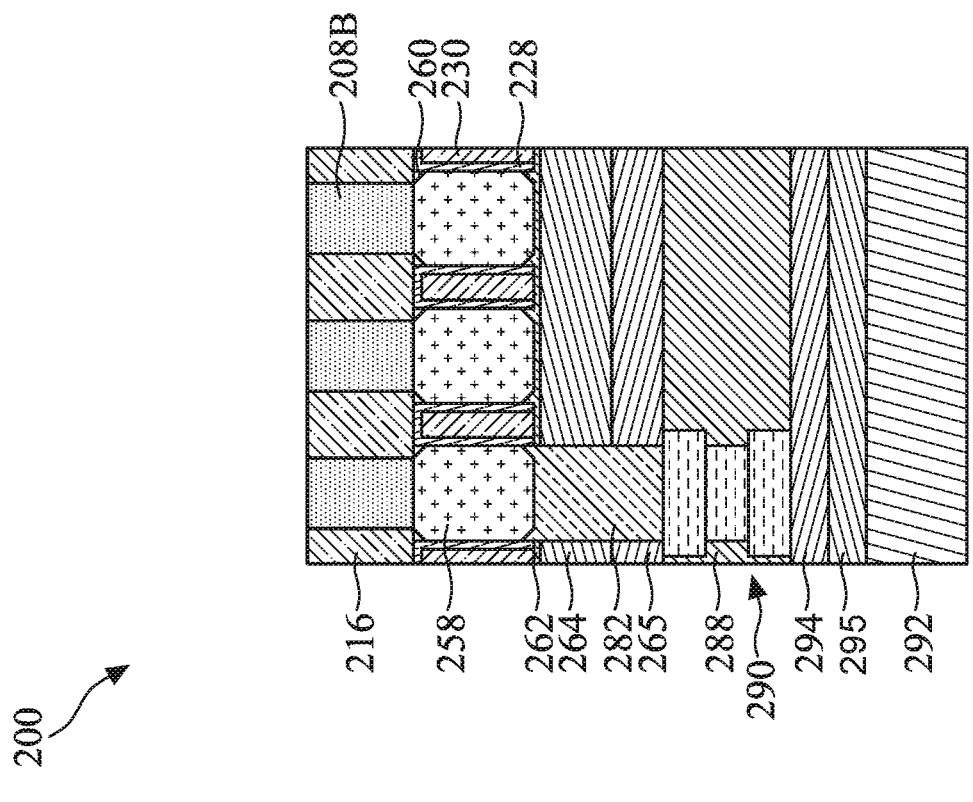
Figure 23A:
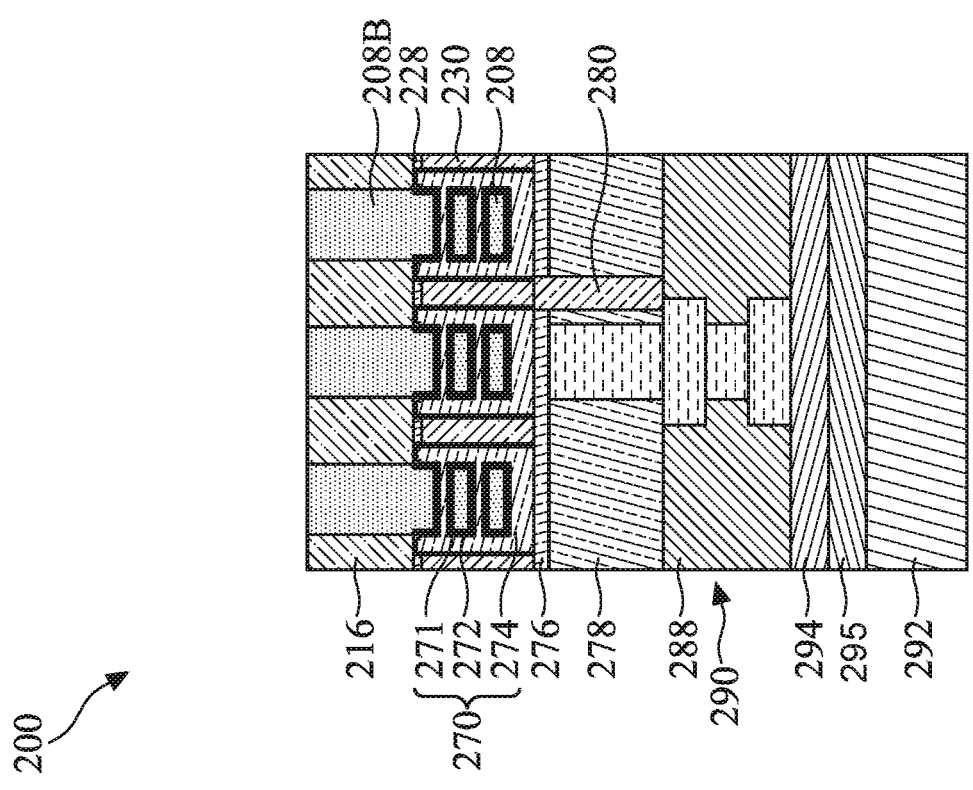

Referring to FIGS. 23A-23B, the method 100 includes a block 134 (FIG. 1B) where the workpiece 200 is thinned down from the backside of the workpiece 200 until the overlaying semiconductor layer 208B and the isolation feature 216 are exposed from the backside of the workpiece 200. An example thinning process may include removing the substrate 202 in a first stage and removing the bottom sacrificial layer 206B in a second stage. In some embodiments, the first stage of the thinning process includes a mechanical grinding process to fully remove the substrate 202, while the bottom sacrificial layer 206B functions as a mechanical grinding stop layer. In some embodiments, the first stage of the thinning process includes a mechanical grinding process and a chemical thinning process. A substantial amount of the substrate 202 may be removed during a mechanical grinding process. Afterwards, a chemical thinning process may apply an etching chemical to the backside of the workpiece to fully remove the substrate 202, while the bottom sacrificial layer 206B may function as an etch stop layer. Similarly, in some embodiments, the second stage of the thinning process includes a mechanical grinding process to fully remove the bottom sacrificial layer 206B and a portion of the overlaying semiconductor layer 208B, while the isolation feature 216 functions as a mechanical grinding stop layer.

Figures 24A, 24B:
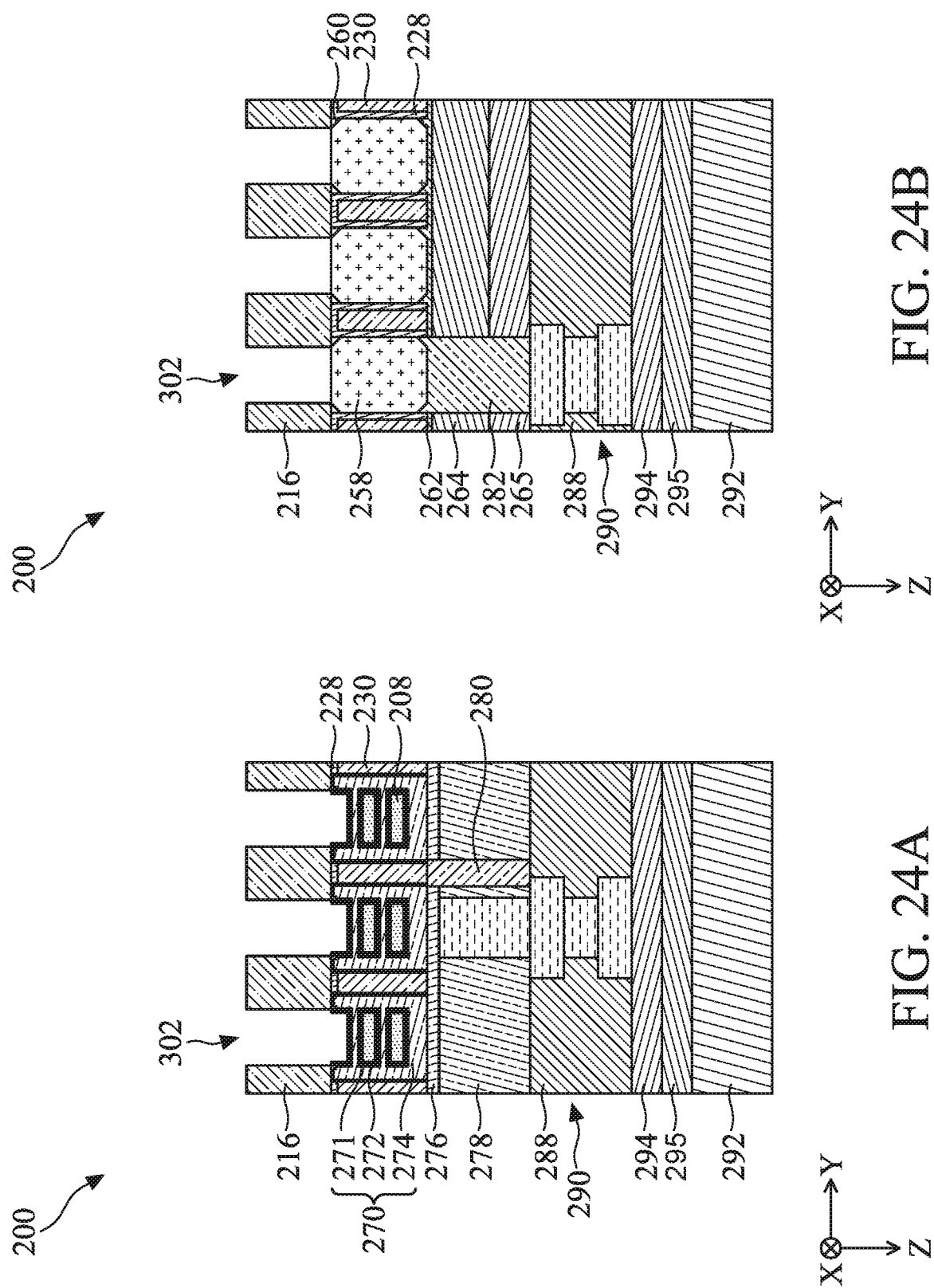

Referring to FIGS. 24A-24B, the method 100 includes a block 136 (FIG. 1B) where the overlaying semiconductor layer 208B is selectively etched to form trenches 302 over the backside of the gate structures 270 and the source/drain features 258. The trenches 302 expose the gate structures 270 (e.g., the interfacial layer 271) and the source/drain features 258 from the backside of the workpiece 200. In one example process, operations at the block 150 applies an etching process that is tuned to be selective to the semiconductor material (e.g. silicon) in the overlaying semiconductor layer 208B and with no (or minimal) etching to the gate structures 270 and the source/drain features 258. The etching process can be dry etching, wet etching, reactive ion etching, or other etching methods. In one embodiment, the etching process also removes the interfacial layer 271 and exposes the high-k dielectric layer 272 in the trenches 302. Further, the voids 260 may remain trapped and unexposed in the trenches 302.

Referring to FIGS. 25A-25B, the method 100 includes a block 138 (FIG. 1B) where a backside dielectric layer 304 with one or more dielectric materials to fill the trenches 302. In some embodiments, the backside dielectric layer 304 may include one or more of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be formed by PE-CVD, F-CVD or other suitable methods. Operations at the block 138 also includes performing a planarization process, such as a CMP process, to the backside dielectric layer 304 to remove excessive dielectric materials from the backside of the workpiece 200 and expose the isolation feature 216. The top surface (proximal to the frontside of the workpiece 200) of the backside dielectric layer 304 interfaces with the gate structures 270 in the channel regions and the source/drain features 258 in the source/drain regions. This top surface may have a step profile with the portion in the channel regions higher than the portion in the source/drain regions. This may be due to over-etching of the overlaying semiconductor layer 208B during forming source/drain recesses 254 at operations of the block 116.

Referring to FIGS. 26A-26B, the method 100 includes a block 140 (FIG. 1B) where the isolation feature 216 is selectively etched to form trenches 296 over the backside of the workpiece 200. The trenches 296 expose the dielectric fins 224 (e.g., the first dielectric layer 228), the gate structures 270 (e.g., the high-k dielectric layer 272), and the facets of the source/drain features 258 that trap the voids 260 in the source/drain regions. In some embodiments, operations at the block 140 applies an etching process that is tuned to be selective to the dielectric materials in the isolation feature 216 and with no (or minimal) etching to the backside dielectric layer 304, the source/drain features 258, the dielectric fins 224, and the high-k dielectric layer 272. The selective etching process can be dry etching, wet etching, reactive ion etching, or other suitable etching methods.

Figures 27A, 27B:
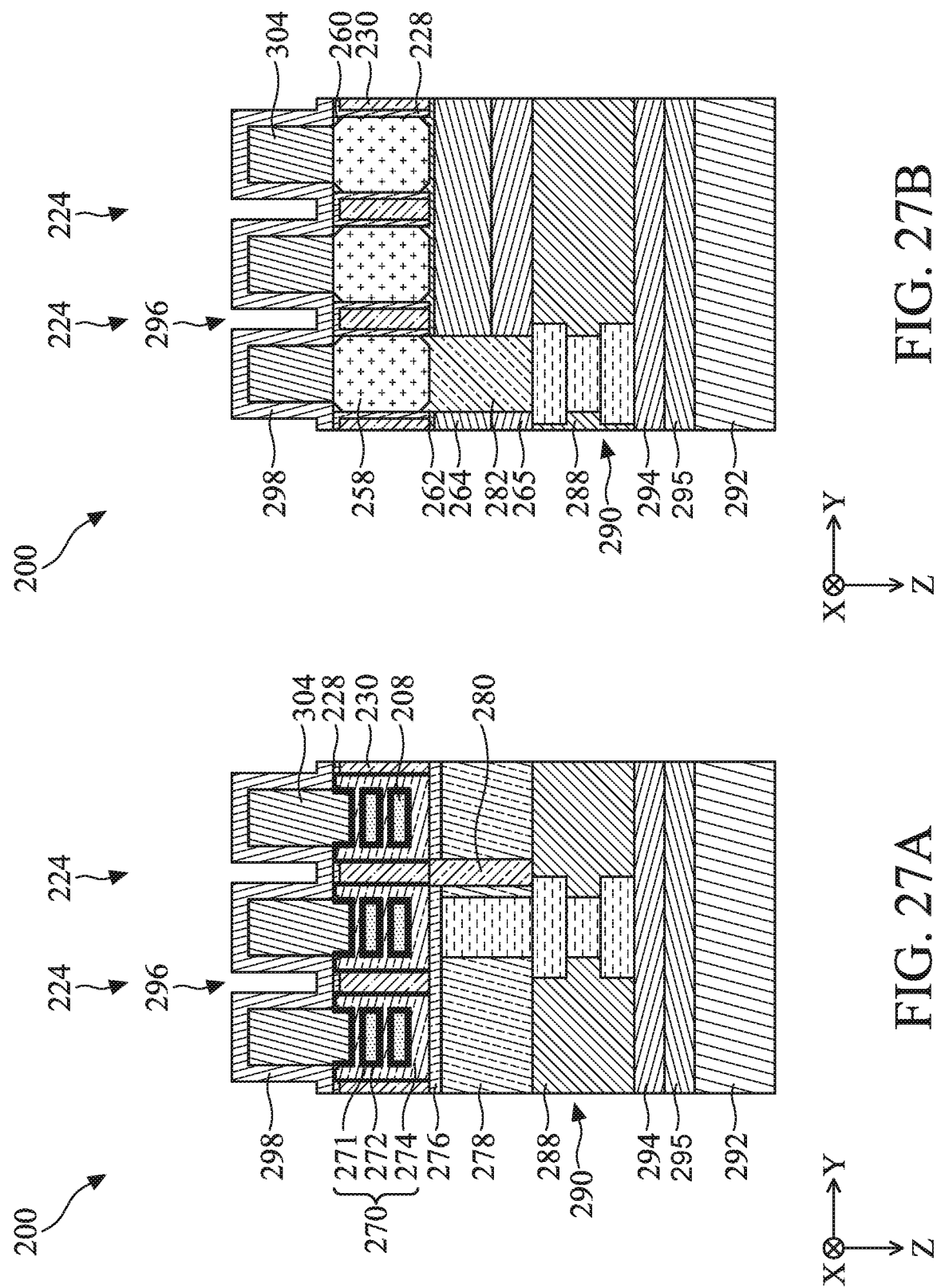
Figures 28A, 28B:
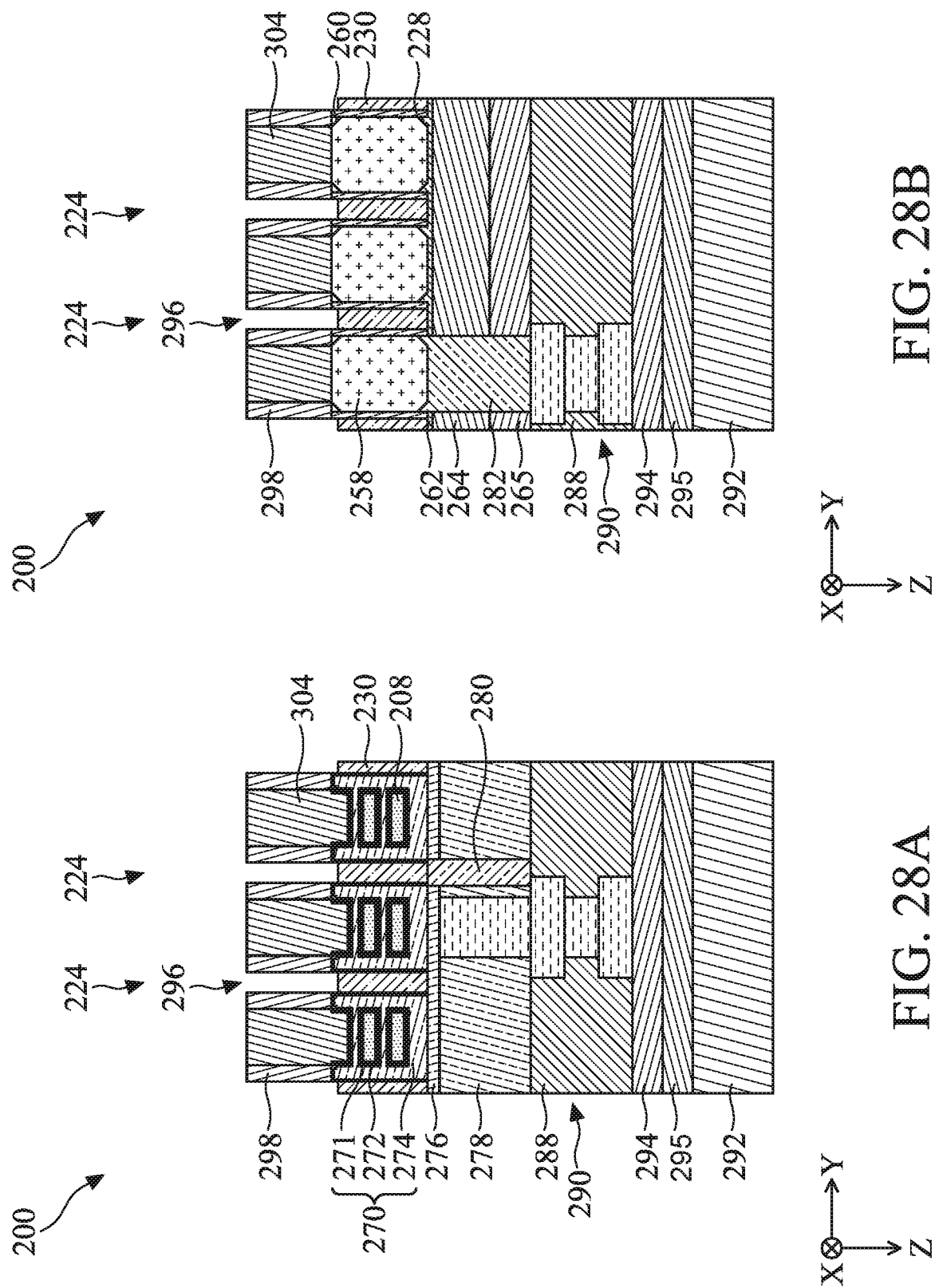

Referring to FIGS. 27A-27B and 28A-28B, method 100 includes a block 142 (FIG. 1B) where a spacer 298 is deposited along sidewalls of the trenches 296. An example process to form the spacer 298 includes first conformally depositing a dielectric layer over the backside of the workpiece 200. The dielectric layer may be conformally deposited using CVD, ALD, or a suitable method. The dielectric layer lines the sidewalls and the bottom surfaces of the trenches 296, as illustrated in FIGS. 27A-27B. The dielectric layer may include SiN, SiCN, SiON, SiOCN, or a suitable dielectric material. Subsequently, the example process etches back the conformally deposited dielectric layer in an anisotropic etching process to remove horizontal portions of the dielectric layer, while vertical portions of the dielectric layer substantially remain as the spacer 298, as illustrated in FIGS. 28A-28B. The anisotropic etching process may be a dry etching process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments, dielectric materials of the spacer 298, the backside dielectric layer 304, the first dielectric layer 228, and the second dielectric layer 230 are different from each other for the purpose of etching selectivity. In some embodiments, the spacer 298 and the first dielectric layer 228 include the same dielectric material, and the etch back process also removes the first dielectric layer 228 and exposes the second dielectric layer 230 in the trenches 296. In the depicted embodiment, the spacer 298 covers the exposed facets of the source/drain features 258. The spacer 298 traps the voids 260 again. The spacer 298 functions to protect the source/drain features 258 from subsequent backside etching processes. The spacer 298 may have a thickness between about 5 nm and about 15 nm. If the thickness of the liner 274 is less than about nm, it may not effectively cover the source/drain features 258. If the thickness of the spacer 298 is larger than about 15 nm, the size of the trenches 296 may shrink too much, which increases difficulties in removing the dielectric fins 224 in subsequent processes.

Figures 29A, 29B:
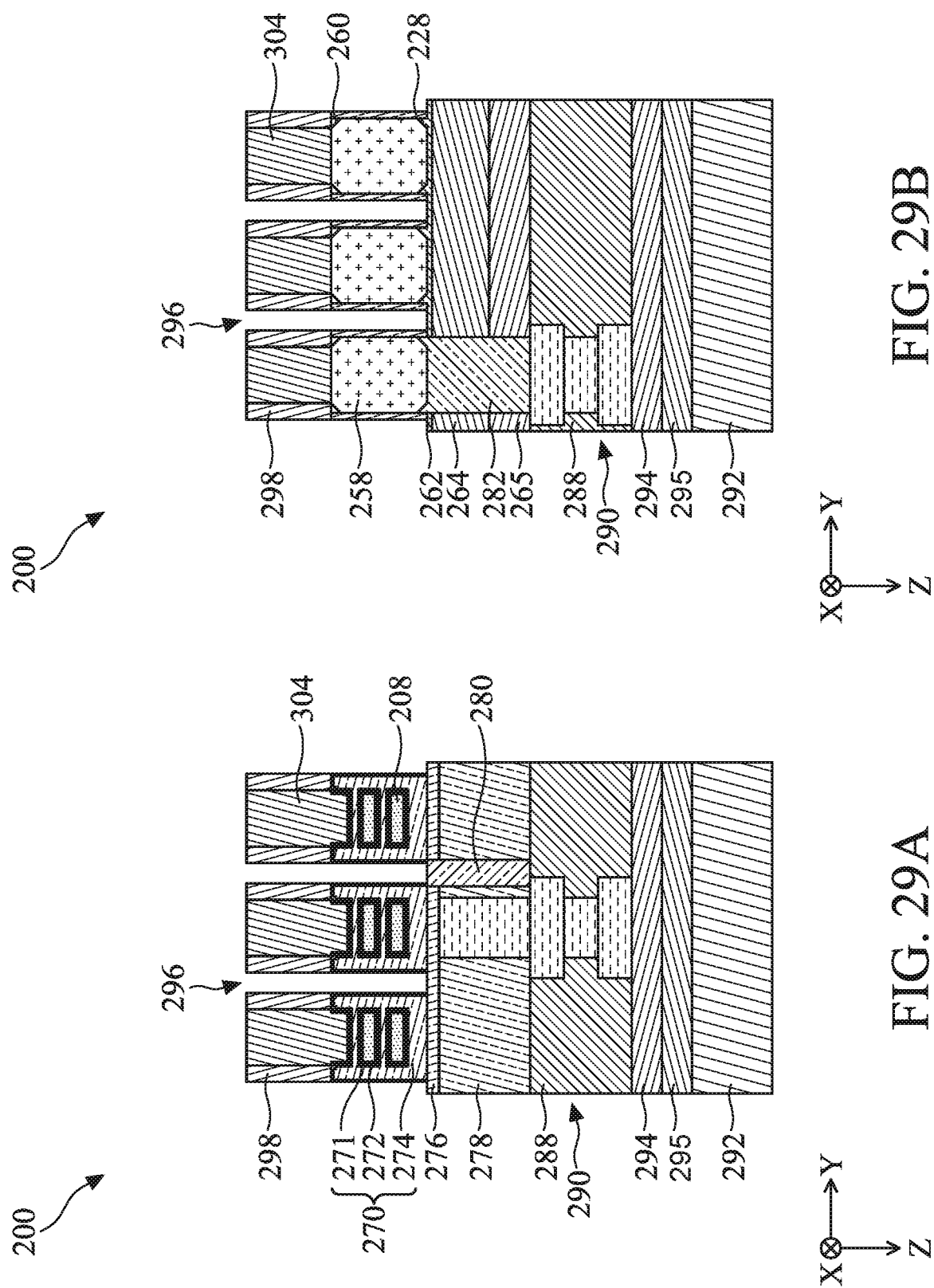

Referring to FIGS. 29A-29B, the method 100 includes a block 144 (FIG. 1B) where the second dielectric layer 230 exposed in the trenches 296 is selectively etched. As discussed above, the first dielectric layer 228 and the second dielectric layer 230 include different material compositions (such as high-k dielectric material for the first dielectric layer 228 and low-k dielectric material for the second dielectric layer 230) to achieve etching selectivity. The selective etching process can be dry etching, wet etching, reactive ion etching, or other suitable etching methods. The removal of the second dielectric layers 230 from the trenches 296 exposes the high-k dielectric layer 272 and the gate cut feature 280 in the channel regions and the first dielectric layer 228 and the CESL 262 in the source/drain regions.

Figure 30A:
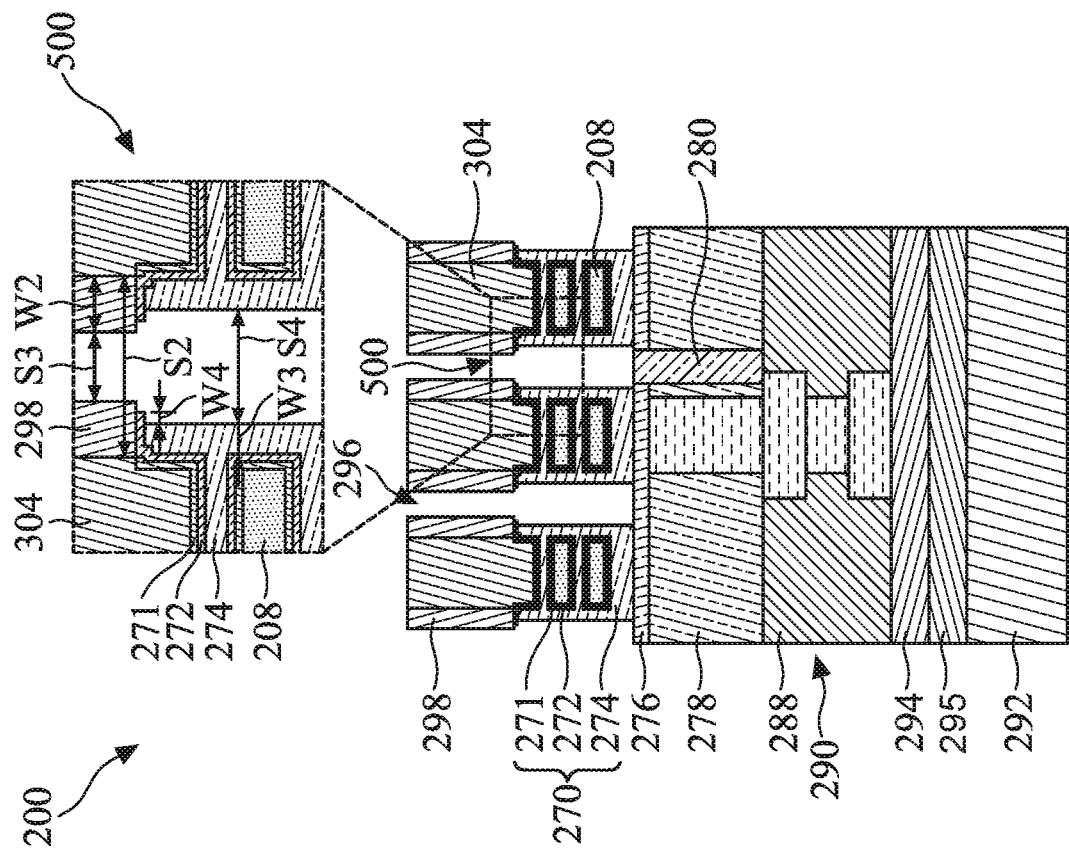
Figure 30B:
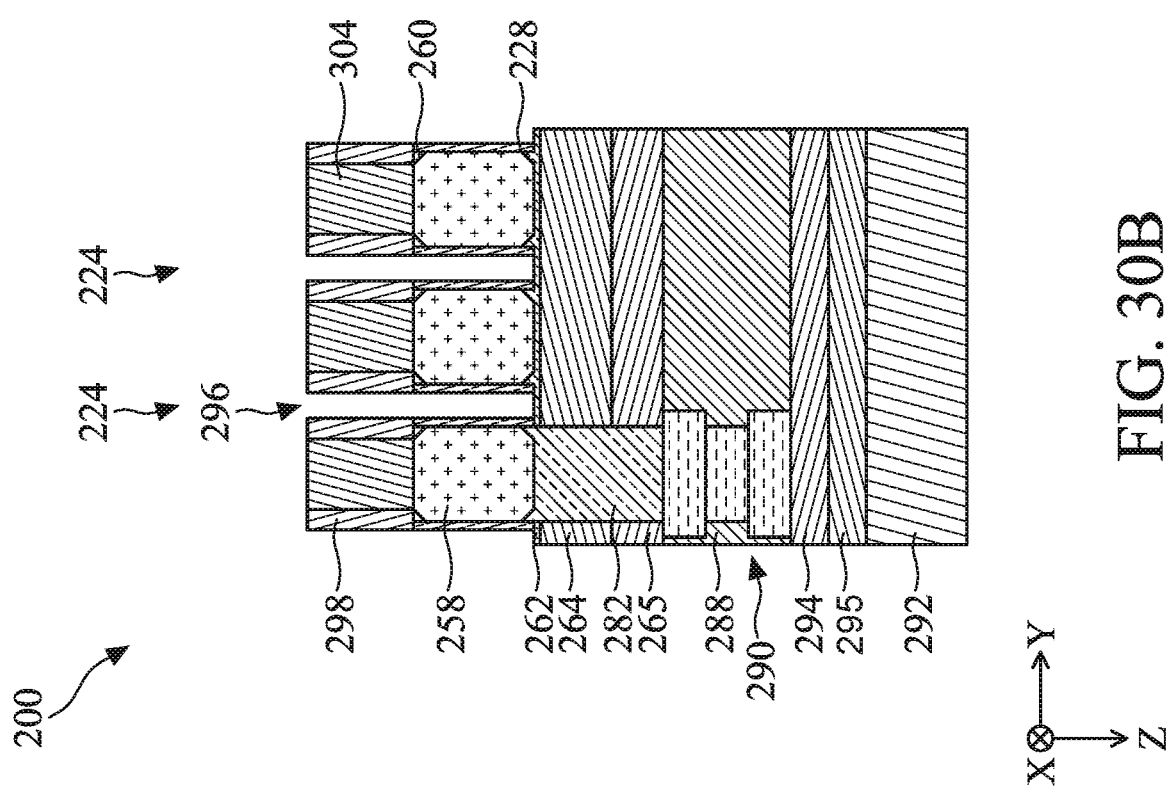

Referring to FIGS. 30A-30B, the method 100 includes a block 146 (FIG. 1B) where the gate structures 270 are trimmed to enlarge portions of the trenches 296 laterally between adjacent gate structures 270. In some embodiments, operations at the block 146 apply an etching process that is tuned to be selective to the materials of the high-k dielectric layer 272 and with no (or minimal) etching to the gate electrode layer 274, such that the exposed portions of the high-k dielectric layer 272 are removed. The removing of the exposed portions of the gate dielectric layer 254 enlarges the lateral distance between adjacent gate structures 270 and thus reduces parasitic capacitance. In some embodiments, operations at the block 146 further apply a second etching process that is tuned to be selective to the materials of the gate electrode layer 274, which further enlarges the lateral distance between adjacent gate structures 270. Each of the first and second etching processes can be dry etching, wet etching, reactive ion etching, or other etching methods. In some instances, the first and second etching processes are both isotropic etching.

A region 500 of the workpiece 200 is enlarged in FIG. 30A. At the conclusion of block 116, the trench 296 has a narrower opening (spacing S3) laterally between the spacer 298 than between the adjacent gate electrodes 274 (spacing S4). In some instances, the spacing S3 ranges from about 3 nm to about 15 nm and the spacing S4 ranges from about 10 nm to about 20 nm. The spacing S3 being smaller than the spacing S4 is due to the deposition of the spacer 298. The spacing S4 may be larger than a width of the gate cut feature 280, such that a bottom surface of the metal cap layer 276 is also exposed in the trench 296. A lateral distance (spacing S2) between opposing sidewalls of the backside dielectric layer 304 (also approximately lateral distance between adjacent channel members 208) ranges from about 22 nm to about 30 nm. The thickness (width W2) of the spacer 298 ranges from about 5 nm to about 15 nm. After the trimming of the gate electrode 274, a thickness (width W3) of the gate electrode 274 on sidewalls of the channel member 274 ranges from about 3 nm to about 8 nm. To be noticed, due to the reduced thickness (by trimming) of the gate electrode 274, a lateral portion of the high-k dielectric layer 272 previously stacked between the spacer 298 and the gate electrode 274 may be uncovered and exposed in the trench 296 for a distance (width W4) that ranges from about 1 nm and about 6 nm. The interfacial layer 271 remains covered under the high-k dielectric layer 272. As a comparison, in the source/drain regions (as in FIG. 31B), sidewalls of the spacer 304 and the first dielectric layer 228 may be flush without forming a step profile.

Figures 31A, 31B:
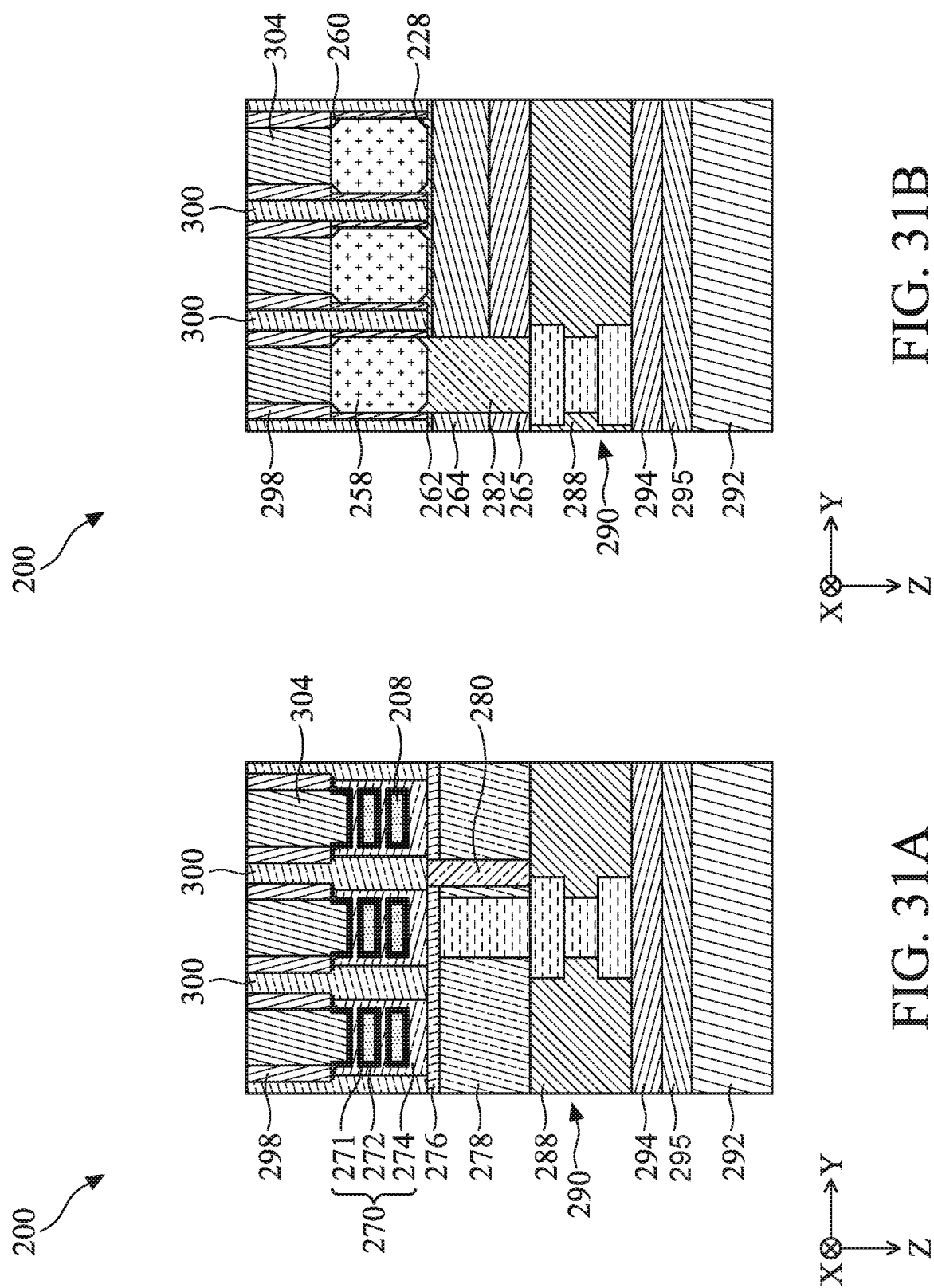

Referring to FIGS. 31A-31B, the method 100 includes a block 148 (FIG. 1B) where a seal layer 300 is deposited over the backside of the workpiece 200 to fill the trenches 296. In some embodiments, the depositing material of the seal layer 300 includes SiN, SiOCN, SiOC, SiCN, combinations thereof, or other suitable material(s). The seal layer 300 may be deposited by CVD, PVD, PE-CVD, coating process, or other suitable deposition techniques. In the channel regions, the seal layer 300 replaces the dielectric fins 224 as a gate isolation feature that provides a larger lateral distance between adjacent gate structures 270, which effectively reduces parasitic capacitance. In the source/drain regions, the seal layer 300 collectively with the remaining portions of the first dielectric layer 228 define a source/drain isolation feature stacked laterally between adjacent source/drain features 258 to provide isolation. Since the spacing between the adjacent source/drain isolation feature is defined by the width of the dielectric fins 224, a width of the seal layer 300 between the adjacent gate structures 270 is larger than a sum of widths of the seal layer 300 and the first dielectric layer 228 between the adjacent source/drain features 258 due to the trimming of the gate structures 270.

Figures 32A, 32B:
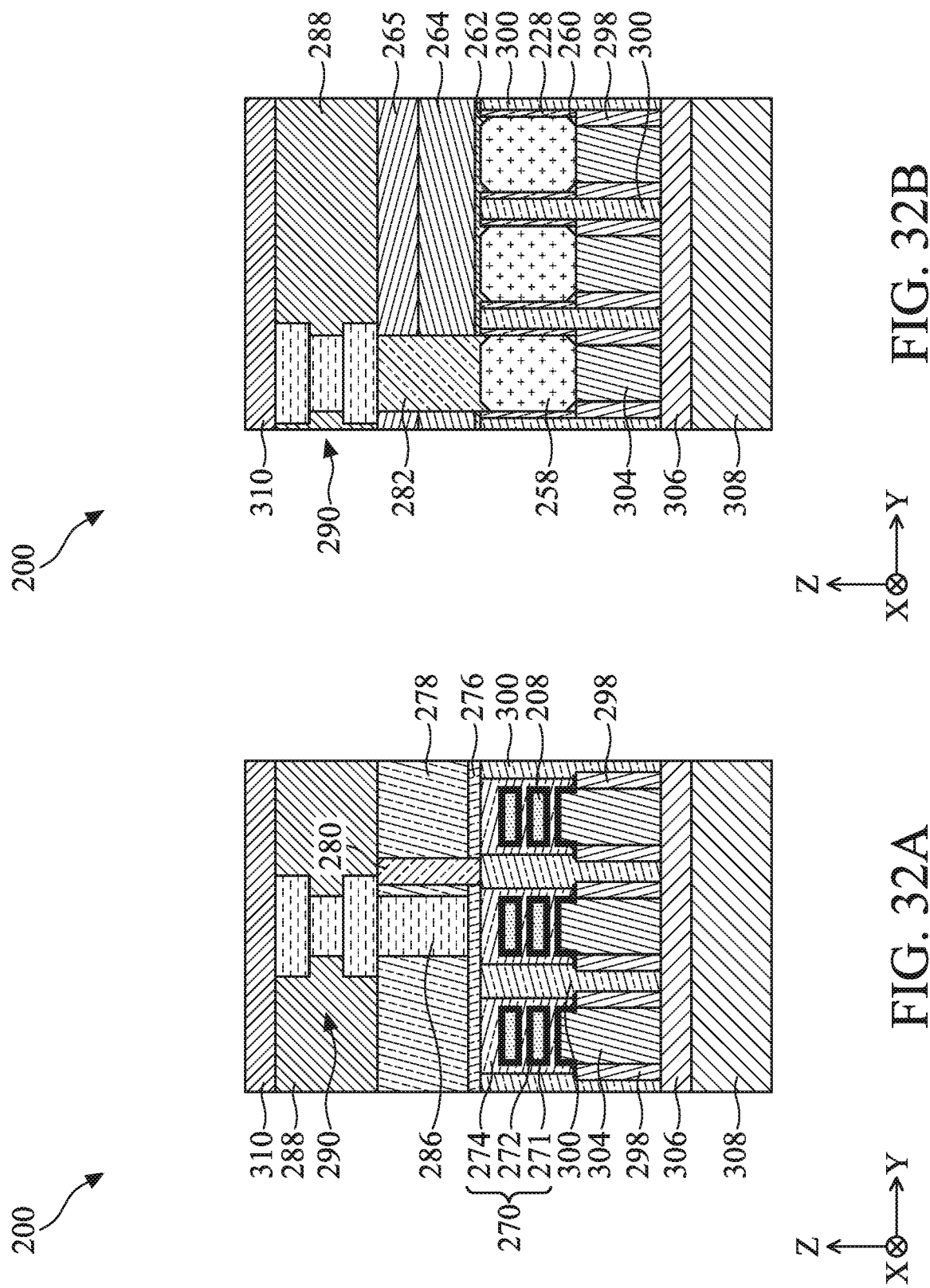

Referring to FIGS. 32A-32B, the method 100 includes a block 150 (FIG. 1B) where a carrier 308 is attached to the backside of the workpiece 200. The carrier 308 may be a silicon wafer in some embodiments. Operations at the block 150 may use any suitable attaching processes, such as direct bonding, hybrid bonding, using adhesive, or other bonding methods. In the illustrated embodiment, a bonding oxide layer 306 is formed on the backside of the workpiece 200 and adjoins the carrier 308 to the backside of the workpiece 200. Operations at the block 150 may further include alignment, annealing, and/or other processes. The attaching of the carrier 308 allows the workpiece 200 to be flipped back. This makes the workpiece 200 accessible again from the frontside of the workpiece 200 for further processing. Operations at the block 150 also includes performing a frontside thinning process, such as a CMP process, to remove the frontside carrier 292, the adhesive layer 295, and bonding oxide layer 294 from the frontside of the workpiece 200 and expose the IMD layers 288. It is noted that the workpiece 200 is flipped back with the frontside facing upward in FIGS. 32A-33B. Further fabrication processes are able to perform on the frontside of the workpiece 200. For example, operations at the block 150 may form additional IMD layer 310 on the IMD layers 288.

Figure 33B:
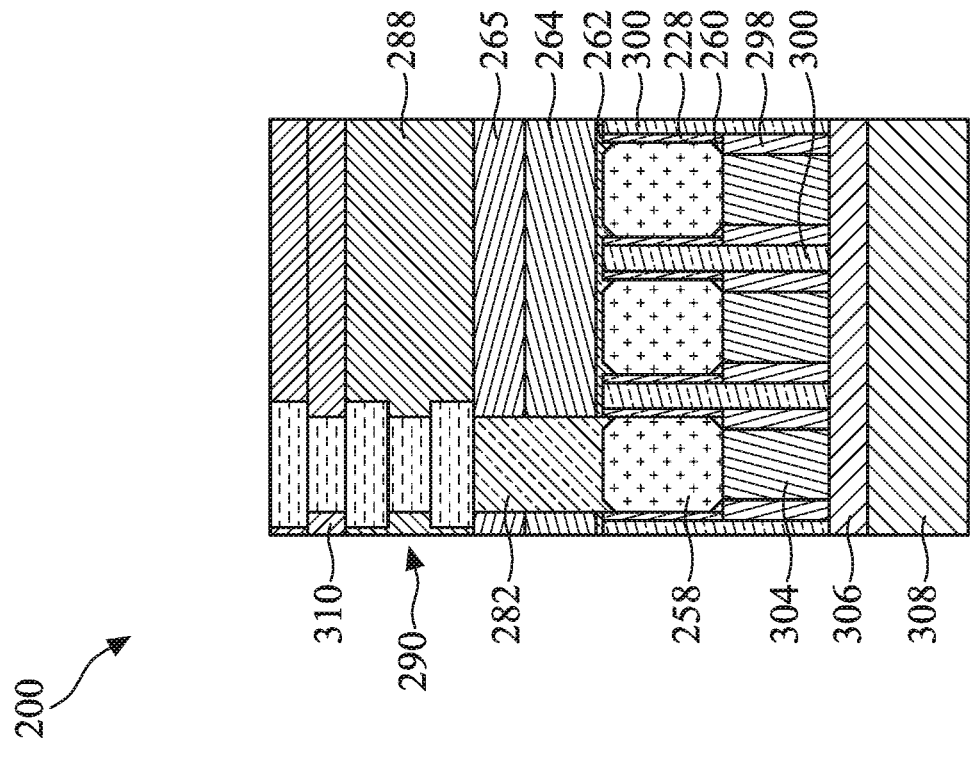
Figure 33A:
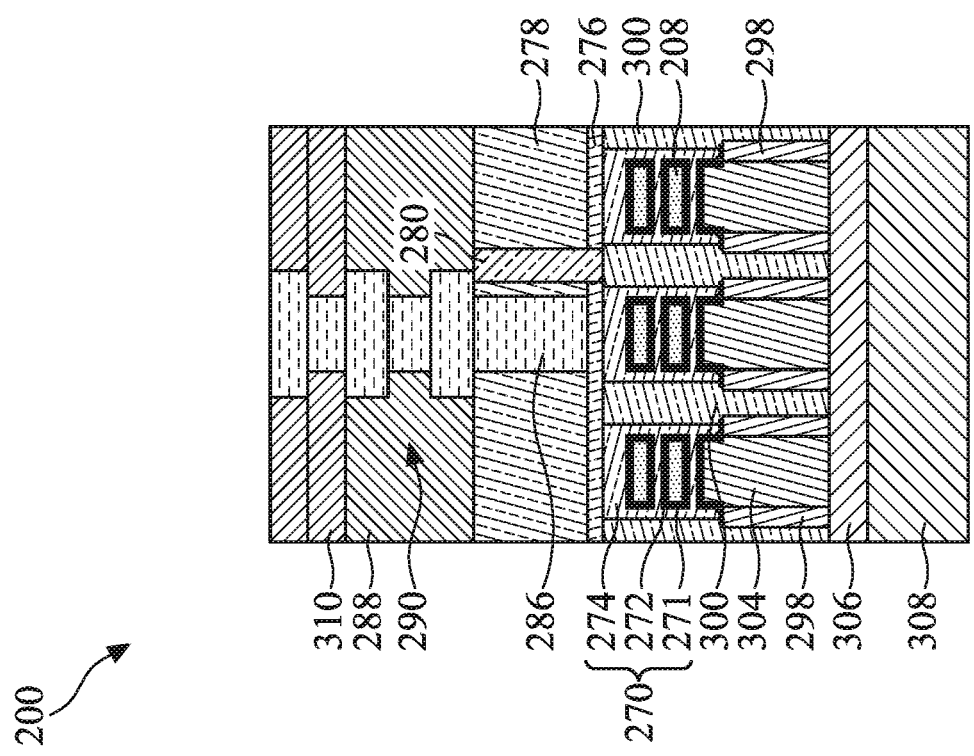

Referring to FIGS. 33A-33B, the method 100 includes a block 152 (FIG. 1B) where further fabrication processes are performed to the workpiece 200. For example, it may perform other BEOL processes to form more interconnect layers, such as frontside power rails, on the frontside of the workpiece 200. In an embodiment, frontside power rails may be formed using a damascene process, a dual-damascene process, a metal patterning process, or other suitable processes. The frontside power rails may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Notably, regarding conductive features, in the depicted embodiment, the source/drain features 258 have no backside conductive features landing thereon, such as backside source/drain contacts and/or backside power rails, therefore there is no concern that the backside processes discussed above may expose such conductive features and cause etching damage during backside etching processes. Accordingly, backside etching fidelity is enhanced. Operations at the block 152 may also include forming passivation layers on the frontside of the workpiece 200, performing other BEOL processes, and removing the backside carrier 308.

Still referring to FIGS. 33A and 33B, upon conclusion of the method 100, in the illustrated cross-sectional view of Y-Z plane, three MBC transistors T-1, T-2, and T-3 separated by the seal layer 300 are formed. Each MBC transistor includes a gate structure 270 engaging one or more channel members 208. In each MBC transistor, the gate structure 270 wraps around all four sides of each channel member 208. The MBC transistors may be referred to as nanosheet transistors. With device scaling down, close proximity between the channel members leads to close proximity between the gate structures engaging these channel members, while leads to high parasitic capacitance between gate structures even with low-k dielectric material for isolation structures. By implementing gate isolation features, such as the seal layer 300, from the backside of the workpiece 200 to replace dielectric fins, the process allows the gate structures to be further trimmed to enlarge spacing between adjacent gate structures, which in turn leads to less parasitic capacitance and better isolation. In the channel regions, the seal layer 300 directly contacts the gate cut feature 280. The seal layer 300 and the gate cut feature 280 may include different material compositions. In the depicted embodiment, a top surface of the seal layer 300 in below a bottom surface of the metal cap layer 276. In some embodiments, the removing of the dielectric fin 224 also recesses a bottom surface of the gate cut feature 280, therefore, a top surface of the seal layer 300 may be between a bottom surface and a top surface of the gate cut feature 280. Alternatively, the seal layer 300 and the gate cut feature 280 may include the same material composition. Further, using structures on the backside of the workpiece, the formation of the trench of the present disclosure is self-aligned on the dielectric fins and does not rely on high resolution or high overlay precision of the photolithography process. To be noticed, the gate structure 270 of the MBC transistors T-3 is isolated from the gate structures 270 of the MBC transistors T-1 and T-2 due to the dividing of the metal cap layer 276 by the seal layer 300 and the gate cut feature 280 collectively, while the gate structures 270 of the MBC transistors T-1 and T-2 are still electrically connected through the metal cap layers 276 from the frontside of the workpiece 200.

In one exemplary aspect, the present disclosure is directed to a method. The method includes providing a workpiece including a frontside and a backside. The workpiece includes a substrate, a first plurality of channel members over a first portion of the substrate, a second plurality of channel members over a second portion of the substrate, a first gate structure engaging the first plurality of channel members, a second gate structure engaging the second plurality of channel members, a dielectric fin disposed between the first and second gate structures, an isolation feature disposed under the dielectric fin and sandwiched between the first and second portions of the substrate. The substrate is at the backside of the workpiece and the first and second pluralities of channel members are at the frontside of the workpiece. The method also includes forming a metal cap layer at the frontside of the workpiece, the metal cap layer electrically connecting the first and second gate structures, depositing a dielectric feature on the dielectric fin, the dielectric feature dividing the metal cap layer into a first segment over the first gate structure and a second segment over the second gate structure, etching the isolation feature, thereby forming a trench exposing the dielectric fin at the backside of the workpiece, depositing a spacer layer on sidewalls of the trench, etching the dielectric fin, thereby exposing a bottom surface of the dielectric feature in the trench, and depositing a seal layer in the trench. In some embodiments, the trench also exposes a portion of the first and second gate structures. In some embodiments, the method further includes after the etching of the dielectric fin, trimming the first and second gate structures to enlarge a width of the trench. In some embodiments, each of the first and second gate structures includes a high-k dielectric layer, where the trimming of the first and second gate structures exposes a portion of the high-k dielectric layer in the trench. In some embodiments, after the trimming of the first and second gate structures, the trench exposes a bottom surface of the metal cap layer. In some embodiments, the depositing of the spacer layer includes conformally depositing a dielectric material layer on the backside of the workpiece, and anisotropically etching the dielectric material layer to remove lateral portions of the dielectric material layer, thereby forming the spacer layer. In some embodiments, the dielectric fin includes an outer layer and an inner layer comprising different materials, and the anisotropically etching of the dielectric material layer also removes the outer layer of the dielectric fin. In some embodiments, the dielectric fin includes an outer layer and an inner layer comprising different materials, and the etching of the dielectric fin includes removing the inner layer from a source/drain region while the outer layer remains in the source/drain region. In some embodiments, the method further includes prior to the etching of the isolation feature, thinning the substrate from the backside of the workpiece to expose the isolation feature. In some embodiments, the method further includes replacing the first and second portions of the substrate with a backside dielectric layer.

In another exemplary aspect, the present disclosure is directed to a method of forming a semiconductor device. The method includes forming a plurality of channel members over a substrate, the channel members being vertically stacked, forming a dielectric fin abutting lateral ends of the channel members, forming a gate structure engaging each of the channel members, removing the substrate, thereby forming a first trench exposing a bottom surface of the gate structure, depositing a first dielectric layer in the first trench, after the depositing of the first dielectric layer, forming a second trench exposing a bottom surface of the dielectric fin, removing the dielectric fin, thereby exposing a sidewall of the gate structure in the second trench, partially removing the gate structure, thereby increasing a volume of the second trench, and depositing a second dielectric layer in the second trench. In some embodiments, the method further includes forming a metal capping layer interfacing the gate structure and the dielectric fin, etching the metal capping layer, thereby forming an opening exposing the dielectric fin, and forming a dielectric feature through the opening and interfacing the dielectric fin. In some embodiments, the second dielectric layer interfaces the dielectric feature. In some embodiments, the method further includes after the forming of the second trench, depositing a spacer layer on sidewalls of the second trench, thereby reducing an opening of the second trench. In some embodiments, the method further includes forming a source/drain feature abutting sidewalls of the dielectric fin, where the spacer layer traps a void under bottom facets of the source/drain feature. In some embodiments, the partially removing of the gate structure includes etching a gate electrode layer in the gate structure, thereby exposing a high-k dielectric layer in the second trench.

In another exemplary aspect, the present disclosure is directed to a semiconductor device. The semiconductor device includes a first plurality of channel members over a first backside dielectric feature, a second plurality of channel members over a second backside dielectric feature, a first source/drain feature abutting the first plurality of channel members and over the first backside dielectric feature, a second source/drain feature abutting the second plurality of channel members and over the second backside dielectric feature, a first gate structure wrapping around each of the first plurality of channel members, a second gate structure wrapping around each of the second plurality of channel members, a metal capping layer disposed on the first and second gate structures, a first isolation feature includes a first portion stacked between the first and second gate structures and a second portion stacked between the first and second source/drain features, and a second isolation feature through the metal capping layer and landing on the first isolation feature. In some embodiments, the first portion of the first isolation feature has a width larger than the second portion of the first isolation feature. In some embodiments, the first isolation feature includes a third portion stacked between the first and second backside dielectric features, wherein the first portion of the first isolation feature has a width larger than the third portion of the first isolation feature. In some embodiments, the semiconductor device further includes a first spacer stacked between the first backside dielectric feature and the first isolation feature, and a second spacer stacked between the second backside dielectric feature and the second isolation feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a first channel member over a first backside dielectric feature;
   a first gate structure engaging the first channel member;
   a second channel member over a second backside dielectric feature;
   a second gate structure engaging the second channel member; and
   a first isolation feature includes a first portion laterally between the first and second backside dielectric features and a second portion laterally between the first and second gate structures, wherein the first isolation feature is in physical contact with the first and second gate structures.

2. The semiconductor device of claim 1, wherein the second portion has a larger width than the first portion.

3. The semiconductor device of claim 1, wherein each of the first and second gate structures includes a gate dielectric layer and a gate electrode layer, and wherein the second portion of the first isolation feature is in physical contact with the gate electrode layer.

4. The semiconductor device of claim 1, wherein a top surface of the first isolation feature is substantially coplanar with a top surface of the first and second gate structures.

5. The semiconductor device of claim 1, further comprising:
   a second isolation feature disposed on a top surface of the first isolation feature, wherein a top surface of the second isolation feature is above a top surface of the first and second gate structures.

6. The semiconductor device of claim 5, further comprising:
   a metal capping layer disposed on the top surface of the first and second gate structures, wherein the second isolation feature divides the metal capping layer into two segments.

7. The semiconductor device of claim 5, wherein the second portion has a larger width than the second isolation feature.

8. The semiconductor device of claim 1, further comprising:
   a first spacer disposed between the first backside dielectric feature and the first portion; and
   a second spacer disposed between the second backside dielectric feature and the first portion.

9. The semiconductor device of claim 1, wherein the first gate structure wraps around the first channel member, and the second gate structure wraps around the second channel member.

10. The semiconductor device of claim 1, further comprising:
    a first epitaxial feature abutting the first channel member; and
    a second epitaxial feature abutting the second channel member,
    wherein the first isolation feature includes a third portion laterally between the first and second epitaxial features.

11. The semiconductor device of claim 10, wherein the second portion has a larger width than the third portion.

12. A semiconductor device, comprising:
    a plurality of channel members over a backside dielectric feature;
    a gate structure wrapping around each of the channel members;
    a first isolation feature disposed on a first sidewall of the gate structure, the first isolation feature extending vertically from a bottom surface of the backside dielectric feature to a top surface of the gate structure; and a second isolation feature disposed on a second sidewall of the gate structure, the second isolation feature extending vertically from the bottom surface of the backside dielectric feature to the top surface of the gate structure.

13. The semiconductor device of claim 12, further comprising:

a metal capping layer covering the top surface of the gate structure and covering a top surface of the first isolation feature.

14. The semiconductor device of claim 13, further comprising:

a third isolation feature disposed on a top surface of the second isolation feature, wherein a top surface of the third isolation feature is above a top surface of the metal capping layer.

15. The semiconductor device of claim 13, further comprising:

a gate contact landing on the metal capping layer.

16. The semiconductor device of claim 12, wherein each of the first and second isolation features is in physical contact with a gate electrode layer of the gate structure.

17. A semiconductor device, comprising:

a first plurality of channel members over a first backside dielectric feature;

a second plurality of channel members over a second backside dielectric feature;

a first source/drain feature abutting the first plurality of channel members and over the first backside dielectric feature;

a second source/drain feature abutting the second plurality of channel members and over the second backside dielectric feature;

a first gate structure wrapping around each of the first plurality of channel members;

a second gate structure wrapping around each of the second plurality of channel members;

a metal capping layer disposed on the first and second gate structures;

a first isolation feature includes a first portion stacked between the first and second gate structures and a second portion stacked between the first and second source/drain features; and a second isolation feature through the metal capping layer and landing on the first isolation feature.

18. The semiconductor device of claim 17, wherein the first portion of the first isolation feature has a width larger than the second portion of the first isolation feature.

19. The semiconductor device of claim 17, wherein the first isolation feature includes a third portion stacked between the first and second backside dielectric features, wherein the first portion of the first isolation feature has a width larger than the third portion of the first isolation feature.

20. The semiconductor device of claim 17, further comprising:

a first spacer stacked between the first backside dielectric feature and the first isolation feature; and a second spacer stacked between the second backside dielectric feature and the first isolation feature.

\* \* \* \* \*